United States Patent [19]
Ravindra et al.

[11] Patent Number: 4,931,946
[45] Date of Patent: Jun. 5, 1990

[54] PROGRAMMABLE TILES

[75] Inventors: H. Ravindra, Milpitas; Suhas S. Patil, Cupertino; Ernest S. Lin, Sunnyvale; Mahmud M. Assar, Morgan Hill; Dayakar Reddy, Milpitas, all of Calif.

[73] Assignee: Cirrus Logic, Inc., Milpitas, Calif.

[21] Appl. No.: 166,596

[22] Filed: Mar. 10, 1988

[51] Int. Cl.⁵ .................. G06F 15/60; H01L 27/00
[52] U.S. Cl. .................. 364/490; 364/489; 364/488; 357/45; 307/303; 307/465
[58] Field of Search ........... 364/488, 489, 490, 491; 365/94, 104, 154, 190; 307/465, 303; 357/42, 52

[56] References Cited

U.S. PATENT DOCUMENTS

| | | |
|---|---|---|
| Re. 31,287 | 6/1983 | Patil .................. 340/825.79 |
| 4,249,193 | 2/1981 | Balyoz et al. .................. 357/40 |
| 4,293,783 | 10/1981 | Patil .................. 307/465 |
| 4,414,547 | 11/1983 | Knapp et al. .................. 340/825.83 |
| 4,441,168 | 4/1984 | Luciw .................. 365/154 |
| 4,442,508 | 4/1984 | Knapp et al. .................. 365/104 |
| 4,577,276 | 3/1986 | Dunlop et al. .................. 364/490 |
| 4,631,686 | 12/1986 | Ikawa et al. .................. 364/490 |
| 4,727,493 | 2/1988 | Taylor, Sr. .................. 364/490 |
| 4,745,084 | 5/1988 | Rowson et al. .................. 364/491 |

OTHER PUBLICATIONS

Kent F. Smith, "Design of Regular Arrays Using CMOS in PPL", 1983 IEEE International Conference on Computer Design/VLSI in Computers.
A. Hui et al., "A 4.1K Gates Double Metal HCMOS Sea of Gates Array", IEEE 1985 Custom Integrated Circuits Conference, pp. 15–17.
S. Atiq Raza et al., "Channelless Architecture: A New Approach for CMOS Standard Cell Design", IEEE 1985 Custom Integrated Circuits Conference, pp. 12–14.
Egan et al., "Bipartite Folding and Partitioning of a PLA", IEEE Transactions on Computer-Aided Design, vol. CAD-3, No. 3, Jul. 1984, pp. 191–199.
Hachtel et al., "An Algorithm for Optimal PLA Folding", IEEE Transactions on Computer-Aided Design of Integrated Circuits and Systems, vol. CAD-1, No. 2, Apr. 1982, pp. 63–75.

Primary Examiner—Gary Chin
Assistant Examiner—V. N. Trans
Attorney, Agent, or Firm—Skjerven, Morrill, MacPherson, Franklin & Friel

[57] ABSTRACT

Disclosed is a set of functional components (tiles), consisting in part of subgate elements, which, by their design, facilitate the creation of dense integrated circuits, without forfeiting the capability of modifying the functionality of individual tiles by late mask programming techniques. Overall densities approach those obtained with hand-crafted, custom designs can be obtained in part because such components are designed to be tiled throughout a storage logic array, permitting the creation of orthogonal logic gates as well as individual gates (and more complex functions) the functionality of which is distributed horizontally, vertically and even in a zigzag fashion. Moreover, the transition time from prototype to high volume manufacturing is reduced significantly due to the ease with which even complex functions can be repaired and enhanced.

25 Claims, 23 Drawing Sheets

PRIOR ART

UPPER METAL LAYER ☐
LOWER METAL LAYER ▨

INCORRECT CONTROL STATE MACHINE

| I1 | I2 | S3 | S2 | S1 | S0 | O1 | O2 |
|---|---|---|---|---|---|---|---|
| 0 | 0 | 0+ | 0 | 0 | 0 | + | |
| 0 | ⓪W | 1 | 0+ | 0 | ①W | | + |
| E① | ⓧM | 1 | 0 | Mⓧ+ | 1 | | + |
| 0 | 1 | 1+ | 1+ | 0 | 1ⓧM | + | |
| 1 | 1 | 0+ | 0 | 1⊕E | 0+ | | |
| 1 | 0 | 1 | 0+ | 1 | 1 | ⊕E | ⓧM |
| 1 | 0 | 1 | 1 | 1+ | 1+ | ⓧM | + |
| 1 | 0 | 1+ | 1+ | 0 | 0 | | |
| 1 | 1 | 1 | 1 | 0 | 0+ | + | |
| 1 | 1 | 0 | 0 | 0+ | 0 | | + |
| 0 | 1 | 1 | 0+ | 0+ | 1 | + | |
| X | X | XX | XX | XX | XX | X | X |

← EXTRA ROW

FIG. 12b

CORRECTED CONTROL STATE MACHINE

| I1 | I2 | S3 | S2 | S1 | S0 | O1 | O2 |
|---|---|---|---|---|---|---|---|
| 0 | 0 | 0+ | 0 | 0 | 0 | + | |
| 0 | ① | 1 | 0+ | 0 | ⓪ | | + |
| ⓧ | ① | 1 | 0 | ①+ | 1 | | + |
| 0 | 1 | 1+ | 1+ | 0 | 1⊕ | + | |
| 1 | 1 | 0+ | 0 | 1○ | 0+ | | |
| 1 | 0 | 1 | 0+ | 1 | 1 | ○ | ⊕ |
| 1 | 0 | 1 | 1 | 1+ | 1+ | ⊕ | + |
| 1 | 0 | 1+ | 1+ | 0 | 0 | | |
| 1 | 1 | 1 | 1 | 0 | 0+ | + | |
| 1 | 1 | 0 | 0 | 0+ | 0 | | + |
| 0 | 1 | 1 | 0+ | 0+ | 1 | + | |
| 1 | 1 | 1+ | 1+ | | 1+ | | |

← ADDED MISSING STATE TRANSITION

E: EXTRA SYMBOL  W: WRONG SYMBOL
M: MISSING SYMBOL  X: SPARE CELLS

FIG. 12b'

PROGRAMMABLE TILES

FIELD OF THE INVENTION

This invention relates generally to the design and layout of integrated circuits, and, in particular, to structures comprised of a set of component "tiles" which facilitate the design and layout process, resulting in the creation of dense integrated circuits the functionality of which can be modified easily and inexpensively.

BACKGROUND OF THE INVENTION

Two stages in the creation of integrated circuits—logic design and the layout of circuit components—are heavily interrelated. There are a variety of different design and layout methodologies in use today, each with its corresponding advantages and disadvantages. Some emphasize ease of design and/or modification of the logic/layout of the chip, while others emphasize maximum overall chip density.

Gate arrays, for example, provide logic designers with a large degree of flexibility, both for producing initial logic designs and for later modifying those designs to alter functionality or simply to fix bugs. Gate arrays achieve this degree of flexibility by providing a large number of individual gate resources, each of which has already been fabricated up to but not including the final few mask layers.

With gate arrays, the layout process is greatly simplified. The designer simply connects the gate elements on the uppermost few mask layers utilizing a standard design technique often referred to as "late mask programming". Generally, connections on the top three chip layers (two metal layers and the via between them) may be modified, though sometimes a fourth layer (connecting the lower metal layer and the active gate elements themselves) may also be modified.

Late mask programming, however, includes modifications to virtually any mask layers involved in later "interconnection" steps of the integrated circuit fabrication process. When modifications are required (whether due to design changes or the discovery of bugs), the designer merely alters these layers of the integrated circuit, avoiding the significant time and expense which would be required to modify the layout of additional chip layers.

A significant disadvantage results, however, from the fact that the gate array itself, including the individual resources repeated throughout the array, is not customized for any particular logic design. Many gates may therefore be unused in any particular design, resulting in lower chip density due to this inefficient use of space.

So-called "channelless" gate arrays reduce the amount of wasted space by permitting the routing of connections over the gate resources themselves rather than requiring dedicated space in between these resources. See, e.g., Hui et al., "A 4K Gates Double Metal HCMOS Sea of Gates Array", IEEE 1985 Custom Integrated Circuits Conference, June, 1985, pp. 15–17; LSI Semiconductor Device and Fabrication Thereof, Balyoz et al., U.S. Pat. No. 4,249,193, 2-3-81.

Although the channelless technique yields significant improvements in density over the traditional gate array approach, this technique (because it is not customized for a particular design) still inevitably results in unused resources and hence wasted space. Such wasted space leaves less room for minimizing the size of active transistor elements, thereby resulting in greater chip area dedicated to routing, and hence slower performance.

One alternative to using gate arrays is to use previously created libraries of standard cells. One significant advantage to such an approach is the greater density achieved within each standard cell itself (although not within the channels dedicated to routing connections among standard cells). It is not difficult to understand why a custom 4-bit counter cell, for example, is far more dense than the equivalent counter designed with a gate array. Knowing in advance which transistors will be used for a desired function yields significantly greater density.

Standard cell design techniques, however, create at least two significant problems First, although each standard cell is quite dense, the design of complex functions requires that significant space on the integrated circuit be allocated to route connections among such standard cells. The space dedicated to routing channels often exceeds (for complex functions) the space dedicated to the functional units (e.g., transistors) themselves.

A channelless approach to standard cell design (analogous to that employed with gate arrays) results in a minor increase in density, although not nearly of the significance of the density increases yielded by channelless gate arrays. See Raza et al., "Channel Architecture: A New Approach For CMOS Standard Cell Design", IEEE 1985 Custom Integrated Circuits Conference, June, 1985, pp. 12–14 for a discussion of channelless standard cell design.

The relatively minor density improvement yielded by channelless standard cells can be explained by the difference between gate array and standard cell design. Small areas at the boundaries of standard cells are used for routing, rather than creating dedicated routing channels between cells. While this approach yields some improvement in density, little room for improvement remains within each individual cell due to the customized design of each such cell. In other words, traditional gate arrays leave far greater room for density improvements than do standard cells, because individual gate resources can simply be moved up to replace formerly dedicated routing channels in places where (after the functionality has been determined) little routing actually occurs.

A second disadvantage to standard cell design techniques is the limited ability to achieve changes in functionality when bugs are found or functional modifications are desired. Aside from modifying the routing between cells, little room for functional changes exists. Making even slight modifications to a hand-crafted standard cell is quite difficult, and often requires that many layers of the cell be laid out again from scratch.

Another design alternative, and one which significantly increases chip density, is to create a fully customized layout for each integrated circuit. Not surprisingly, custom integrated circuits are difficult both to design and to modify, and thus require significantly more time and expense than either gate array or standard cell design methods.

A cheaper, more flexible alternative to custom designs is the logic array. Logic arrays provide flexibility comparable to that of gate arrays, but in a different manner. Logic arrays facilitate (some to a greater extent than others) the creation of "distributed functionality"—i.e., functions, such as logic gates, whose inputs, outputs and functional units (e.g., transistors) are distributed throughout the integrated circuit, as opposed to being self-contained within a discrete area, as in a gate array.

The concept of distributed functionality is quite important because it enables the logic designer to vary the number, and often the location, of inputs, outputs and functional elements. Typical logic arrays such as PLAs and PALs, however, permit relatively little distribution of functionality. Although the number and location of the inputs to individual gates along each row of the "AND" and "OR" arrays can be modified, the entire length of an array row is utilized regardless of whether it forms a two-input or a ten-input AND/OR gate. Moreover, the gate resources themselves cannot be relocated throughout the array, nor can functional distribution beyond the "gate level" be achieved (because each "sum of products" occupies an entire row and column of the array, the result of which must be fed back into the array, if possible, as an input).

Another type of logic array, however, known as a storage logic array or SLA, enables a more significant distribution of functionality than is possible with a PLA or PAL. SLAs permit the AND and OR arrays to be interleaved. In addition, SLAs provide means for segmenting the array's rows and columns, as well as for connecting storage elements to any row/column segment. These features dramatically increase design ease, not by limiting flexibility, but by permitting the creation of isolated functionality, such that intermediate results of computations may be utilized within other portions of the array itself. See, e.g., Storage/Logic Array, Patil, U.S. Pat. No. 4,293,783, 10-6-81; Asynchronous Logic Array, Patil, RE 31,287, 6-21-83; Storage Cells For Use in Two Conductor Data Column Storage Logic Arrays, Knapp et al., U.S. Pat. No. 4,442,508, 4-10-84; Storage Logic Array Having Two Conductor Data Column, Knapp et al., U.S. Pat. No. 4,414,547, 11-8-83.

SLAs can, of course, be utilized in the same manner as are PLAs and PALs, with the added benefits of achieving isolated functionality (by segmenting array rows and columns) and faster feedback mechanisms (by employing storage elements within the array itself, rather than merely along the periphery). But, adoption of the SLA approach does not in and of itself yield integrated circuits with densities approaching that of custom designs.

What is needed to achieve such densities is an implementation of the basic SLA approach which permits functionality not only to be isolated within discrete areas of the array, but also to be distributed throughout that area (or perhaps throughout the entire array itself).

Although others have in the past considered applying SLA to other technologies, such as the static CMOS technology employed in the preferred embodiment of this invention, such approaches have previously been analyzed from a limited, local perspective, and thus thought to yield insufficient densities. See, e.g., Smith, Kent F., "Design of Regular Arrays Using CMOS in PPL, 1983 IEEE International Conference on Computer Design/VLSI in Computers", October 31-November 3, 1983. In fact, as is demonstrated below, the use of static CMOS technology not only provides for low power usage, high speed and relatively-high noise immunity, but also yields global densities formerly achieved only with hand-crafted, custom designs.

SUMMARY OF THE INVENTION

The preferred embodiment of this invention (the Cirrus CMOS Cell Set described below) enables a significant degree of distribution of functionality by providing for the "tiling" of subgate and other subfunction components throughout an SLA using a set of static CMOS tiles, while still maintaining the flexibility of modifying individual functional units (tiles) via late mask programming techniques.

By enabling the distribution of functionality throughout a storage logic array, this invention facilitates the creation of dense integrated circuits which can be modified quite easily. As is explained below, such high densities are achieved not only (within individual tiles) but globally (throughout the entire integrated circuit), by dramatically reducing the required area for routing interconnections among individual tiles.

This invention achieves densities approaching that of hand-crafted, custom designs while still maintaining a significant degree of repairability. It involves the mapping of a set of standard "tiles" (logic and/or memory elements) onto one or more grids of a storage logic array, thus combining the advantages of standard cell, gate array and logic array techniques. In effect, this invention yields, for the first time, integrated circuits with densities approaching that of custom designs, yet which are relatively simple both to design (via tiling) and to modify (via late mask programming).

Disclosed is a set of dense component tiles, consisting in part of subgate elements, which make possible a unique logic design and layout approach. These tiles enable the designer of an integrated circuit to achieve a dense circuit simply by tiling such components throughout a storage logic array, creating, for example, orthogonal logic gates as well as individual gates (and more complex functions) which are distributed horizontally, vertically and even in a zigzag fashion, without forfeiting the ability to modify the functionality of individual tiles by late mask programming techniques.

In one respect, the preferred embodiment of this invention consists of a set of static CMOS tiles, consisting of both memory elements, such as flip flops, and logic elements ranging from subgate components to decrementers, adders and ALUs. This set of tiles, however, has a number of advantageous characteristics, the combination of which is not only unique, but also enables the design of extremely dense integrated circuits which are easy both to design and to modify.

Like typical standard cells, the individual tiles of this invention are quite dense—because the intended function of each tile is predetermined. Unlike traditional standard cells, however, the tiles of this invention include subfunction (e.g., subgate) components.

For example, one such tile is a horizontal sub-NAND gate, the layout of which consists of one n-channel and one p-channel transistor. By dissecting the CMOS NAND gate into components at the gate's "lowest common denominator", it becomes possible to design subgate tiles in such a manner as to permit the "tiling" of adjacent cells to form larger, more complex functional units, without requiring dedicated routing channels (or, for that matter, few if any routing channels outside the boundaries of the individual tiles themselves).

This tiling concept yields a number of significant benefits. One such benefit of this tiling of subgate components is that the design and layout of arbitrary gates of fanin "n" is greatly simplified. For example, with a horizontal sub-NAND gate tile, both the logic design and layout of an n-input static CMOS NAND gate can be achieved simply by tiling n of these tiles together.

The two endmost tiles (connecting to "ground" and to the gate output) are distinguished by appropriate differences in the uppermost three mask layers (in the preferred embodiment), while the middle tiles (creating a series of n-channel and p-channel transistors) are identical to one another. This tiling process is described below in greater detail.

What is significant about this horizontal sub-NAND gate tile is that, with this one tile (whether programmed as a leftmost, rightmost or middle tile), an arbitrary n-input horizontal NAND gate can be constructed with no additional space dedicated for routing.

Additional benefits of logic arrays are also achieved, by utilizing the SLA array structure to permit an almost arbitrary distribution of functionality. Unlike a PLA or PAL, a gate need not occupy an entire row and/or column of the array.

The tiles of an n-input NAND gate need not even be adjacent. By utilizing unused array conductor wires ("free conductor" wires) of a "special blank" subfunction tile (which cannot, without modification, perform any sub-NAND gate function) or of a "normal subfunction" tile (i.e., the other sub-NAND gate tiles of the class of horizontal subNAND gate tiles), one can distribute the inputs, outputs and functional elements of an n-input NAND gate partially or totally across an SLA row or down an SLA column.

The "free conductor" wires of a normal subfunction (or a special blank) tile permit signals to be passed between two tiles, each of which is adjacent to the tile with the unused wires, but not to each other. By repeating this technique with additional tiles containing such unused wires ("free conductor tiles" signals can be passed along virtually any row or column of the array. Signals can also be passed straight through another type of tile (across any row or column) which is truly a "blank" tile, containing solely metal row and column conductors.

Orthogonal gates can be created, for example, by passing the output signal along a row wire of a horizontal gate's tile to the input signal along a column wire of an adjacent tile of a vertical gate. Moreover, by employing special "ohmic" contact tiles, an individual gate can even "zigzag" across rows and down columns throughout the array. Functionality can thus be distributed almost arbitrarily throughout the SLA structure, particularly by utilizing these "free conductor tiles" (whether the free row or column conductors are found in normal subfunction tiles, special blank tiles, blank tiles or ohmic contact tiles).

This distribution of functionality is by no means restricted to logic gates. More complex functions can be created by tiling together "subfunction" components, each of 11 which consists of one or more basic tiles, yielding an extremely dense integrated circuit which is relatively simple to design. Such an approach lends itself quite well to automated software design tools.

Because these tiles are, in essence, mapped onto a storage logic array, the actual layout will require few if any additional routing channels while permitting both the number and location of function inputs, outputs and active elements to be varied almost without limitation. This degree of design flexibility exceeds that of PLAs, in which only gate inputs can be distributed, and even then only across a row of the "AND" array, the length of which is the same regardless of the number of such inputs.

Finally, the functionality of individual tiles can be modified easily, by late mask programming techniques. For example, the orientation of a sub-NAND gate tile (e.g., leftmost, rightmost or middle) can be altered, yielding a significant degree of repairability, perhaps even exceeding that of a gate array (which can be altered, but only by effecting significant modifications to the uppermost mask layers).

Although such changes might on the surface appear minor, significant functional modifications are made possible, such as the transformation of an individual logic gate into multiple gates, as well as the modification of the number and location of inputs. In particular, the ability to modify the control portion of an integrated circuit is enhanced significantly.

Thus, as a result of designing subfunction tiles that can easily be tiled together, thereby enabling the distribution of functionality throughout a storage logic array without requiring dedicated routing channels, an extremely dense integrated circuit can be obtained. In fact, the density yielded by this invention approaches that yielded by full custom designs, but with the significant added advantage of repairability, permitting the designer to effect functional modifications within individual cells (at the gate or even subgate level) via late mask programming techniques Moreover, as routing area is decreased, performance is enhanced. Design time is also significantly decreased due to the ease of tiling, and then subsequently repairing or enhancing individual tiles (by transforming them into other tiles of the same "tile class"), thereby enabling designers to move rapidly from a prototype to high volume production.

In summary, the preferred embodiment of this invention encompasses a set of customized tiles described in detail below. By tiling these tiles together, much as a child builds houses and trees with a set of basic "LEGO" blocks, the integrated circuit designer obtains a number of significant benefits, including design ease, performance and flexibility beyond that yielded by gate arrays, PLAs and PALs (due to the ability to distribute functionality throughout a storage logic array), density beyond that obtained with channelless gate arrays and standard cells, and approaching that of full custom designs (due to the tiling of subfunction components), and repairability, via late mask programming techniques, comparable to that afforded by gate arrays (due to the incorporation of individual subfunction tiles within the structure of an SLA).

This invention will be more fully understood in conjunction with the following detailed description, illustrated by the attached drawings.

BRIEF DESCRIPTION OF THE DRAWINGS

FIGS. 12a, 12b, 12c and 12d illustrate the significant degree of repairability, via late mask programming, afforded Cirrus CMOS Cell Set users. Illustrated are the state graph, tabular and symbolic (before and after repair) representations, respectively, of the control portion of a finite state machine.

DETAILED DESCRIPTION OF THE PREFERRED EMBODIMENT

The following description is meant to be illustrative only and not limiting. While the preferred embodiment of this invention is described, other embodiments (which implement the same modular, yet repairable design features of this invention, but which utilize different tiles, sets of tiles and layout technologies) will be obvious in view of the following description.

Tiling in a Storage Logic Array

Figure 1A:
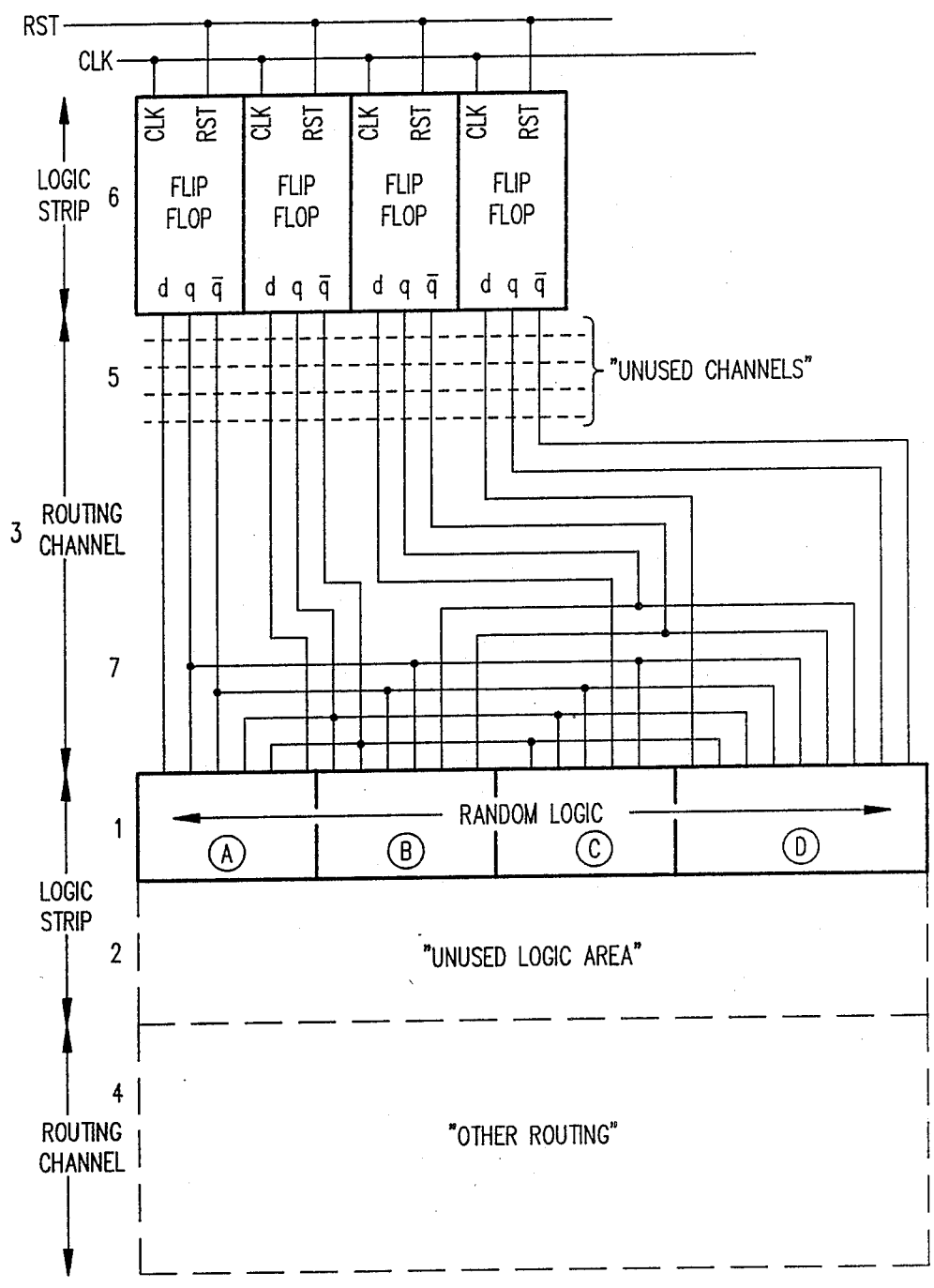
FIGS. 1a, 1b, 1c and 1d illustrate typical gate array, channelless gate array, standard cell and PLA structures, respectively.
Figure 1B:
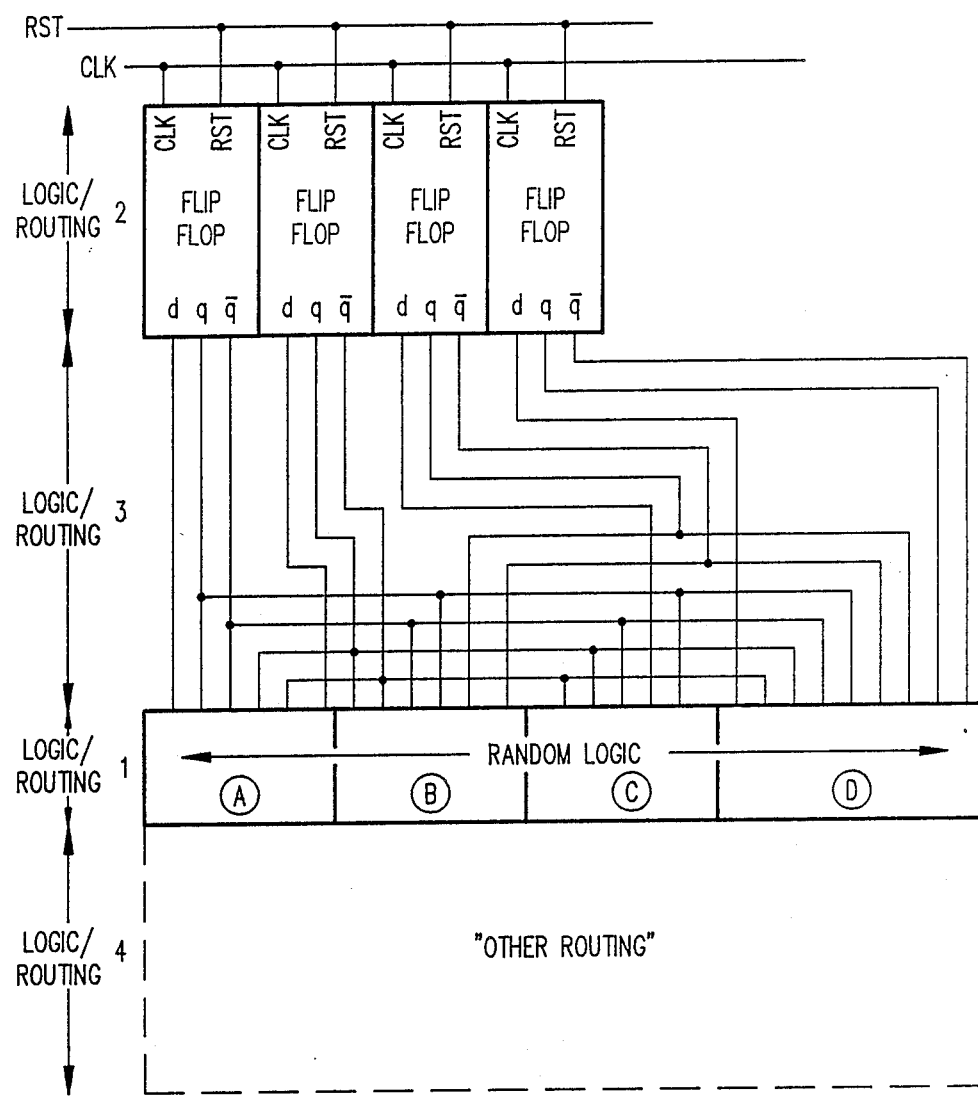
Figure 1C:
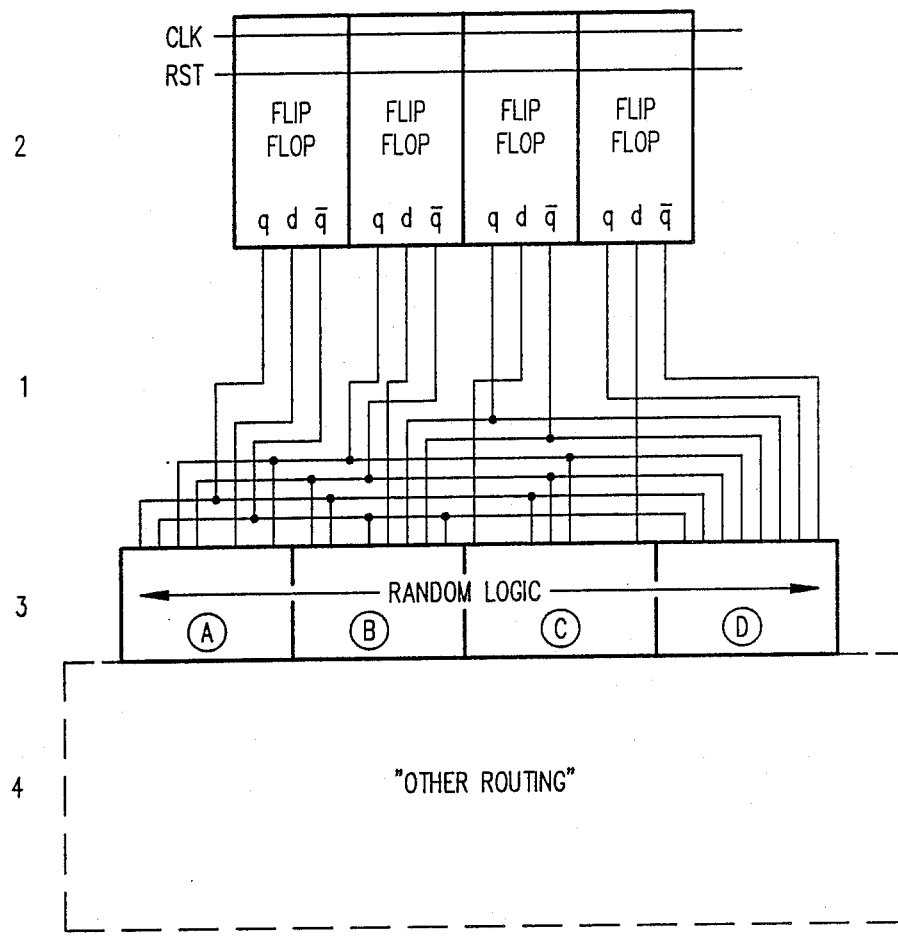
Figure 1D:
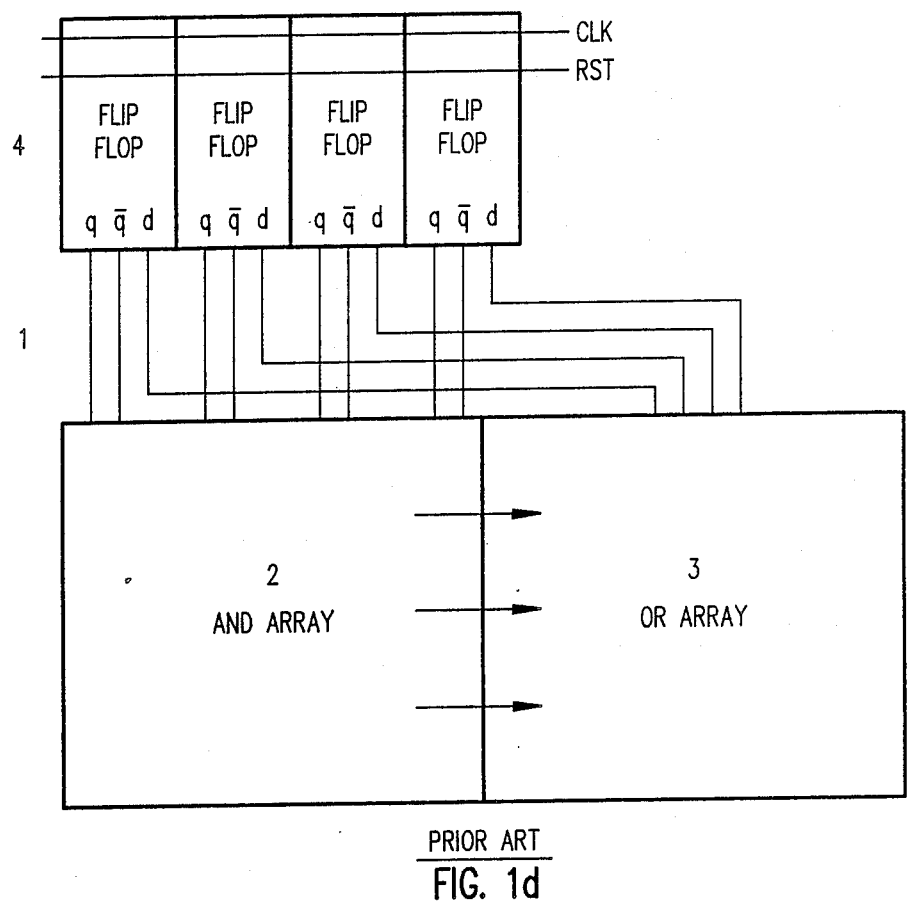
Figure 2:
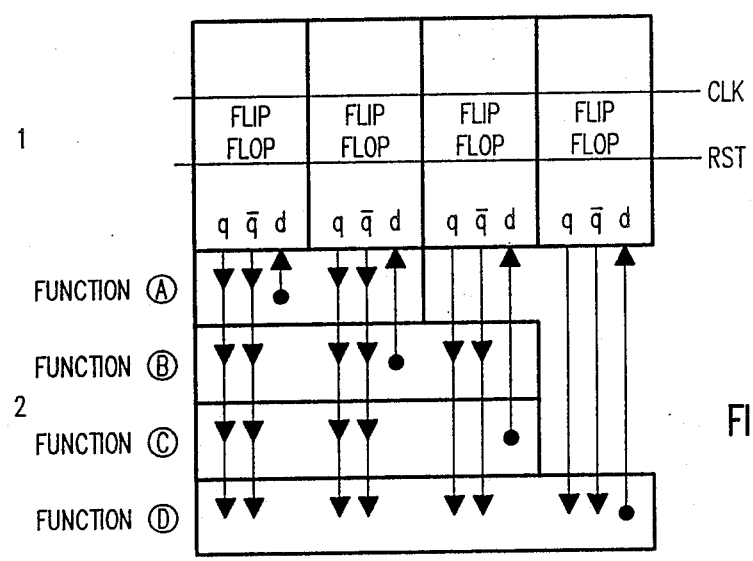
FIG. 2 illustrates a structure created by tiling together component tiles of the Cirrus CMOS Cell Set (the preferred embodiment of this invention) onto an SLA template.

FIGS. 1a–1d, when contrasted with FIG. 2, illustrate the dramatic differences between prior art approaches and that of the preferred embodiment—the Cirrus CMOS Cell Set, consisting of cells ("tiles") to be tiled onto a storage logic array template.

For example, the typical "gate array", although highly repairable through late mask programming, has significant density problems, illustrated quite clearly in FIG. 1a. Because the Random Logic area 1 (consisting, in this example, of four "gates" or more complex functions, A, B, C and D) is not determined prior to fabrication of the underlying active logic resources, it is inevitable that certain of those resources will be unused in the final integrated circuit (as illustrated in the Unused Logic Area 2).

In addition to this wasted space for the active logic resources themselves, additional loss of density occurs due to the gate array's dedicated routing channels 3 and 4. Just as certain logic resources go unused, it is also inevitable that the gate array's use of fixed-width routing channels will result in unused channels 5 once the actual logic is implemented and interconnections are determined.

Some of these unused routing channels and unused active logic resources can be reclaimed, as illustrated in FIG. 1b, by a structure known as a channelless gate array. Rather than defining fixed routing channels, the channelless gate array utilizes a "sea of gates" (i.e., active logic elements throughout the entire integrated circuit) which can be used for mere routing.

In essence, if we assume that routing channel 3, between the Flip Flops 6 and Random Logic area 1 in FIG. 1a, is no longer a fixed-width routing channel, that area can then be utilized for both logic and routing, by "pushing up" both the actual routing 7 and the Random Logic area 1 over the area formerly occupied by unused routing channels 5. In other words, because channelless gate arrays have no fixed routing channels, they enable this wasted space to be reclaimed.

Thus, looking at FIG. 1b, instead of beginning with dedicated logic and routing channels, the channelless gate array initially is comprised of a "sea of gates" any area of which can be used to build random logic, with the remaining areas being utilized for the necessary routing. Once Random Logic area 1 has been determined (with functions A, B, C and D occupying, of course, the same area as the Random Logic area 1 in FIG. 1a), it can be placed as close to the Flip Flops 2 as is possible while still leaving sufficient area for the actual routing 3 between Random Logic area 1 and Flip Flops 2. In essence, the unused routing channels 5 and unused logic area 2 of FIG. 1a are reclaimed for other routing 4 between Random Logic area 1 and any additional logic which may be required on the channelless gate array in FIG. 1b.

Yet, even channelless gate arrays do not achieve densities comparable to those of standard cell designs, as illustrated in FIG. 1c. Although the Routing Area 1 of a standard cell design is roughly as large as that of a channelless gate array, significant improvements in density occur in the Flip Flops 2 and in the Random Logic 3, because these components ("standard cells") are designed "from scratch". Thus, for example, each of functions A, B, C and D is compressed into a relatively dense area because only the necessary logic resources are used, and they are placed so as to provide for minimal routing among such resources.

The disadvantage of standard cell (custom) designs, however, is that they cannot be modified without redesigning many of the base layers of the integrated circuit (unlike gate arrays, which can be modified relatively easily, via late mask programming techniques).

Finally, FIG. 1d illustrates another common design approach, the PLA, in which the routing area 1 between the active logic elements (contained within the AND and OR arrays 2 and 3) and the flip flops 4 is comparable to that of standard cells and channelless gate arrays. Yet, the area occupied by the active logic elements within the AND and OR arrays 2 and 3 is significantly larger than, for example, the random logic within standard cells. Yet, the PLA offers not only a significant degree of repairability (via late mask programming), but also the ability, albeit limited, to distribute the functionality of individual logic gates. The significance of distribution of functionality is discussed in greater detail below Thus, the prior art techniques illustrated in FIGS. 1a–1d, as well as hand-crafted, custom design techniques, all sacrifice to a significant degree either density (gate arrays, channelless gate arrays and PLAs) or repairability (standard cells and hand-crafted custom designs).

Comparing these prior art design techniques with the Cirrus CMOS Cell Set tiling approach illustrated in FIG. 2, it is apparent that the preferred embodiment of this invention virtually eliminates the need for routing channels (much less dedicated, fixed-length routing channels). Individual "tiles" (such as the Flip Flops 1 and logic functions 2 illustrated in FIG. 2) are tiled together with adjacent tiles much like a child connects adjacent "LEGO blocks".

Although certain distributed function tiles (as opposed to large single function tiles, such as flip flops) might not be quite as dense as their "standard cell" counterparts, the significant increase in inter-tile routing density afforded by the flexible approach of tiling adjacent subgate (or more complex "subfunction") components on an SLA template more than compensates for the lower density of individual tiles, resulting in overall densities approaching that of custom, hand-crafted designs.

This result can be explained by the fact that a significant portion of the area occupied by complex integrated circuits is utilized by the interconnections (routing) among logic and/or memory elements. Thus, this invention increases overall density not by increasing the number of logic and/or memory elements (e.g., transistors) on an integrated circuit, but by decreasing the amount of routing area required to interconnect such elements.

Moreover, as demonstrated below, the flexibility afforded by the design of the Cirrus CMOS Cell Set tiles (e.g., subgate tiles) provides the designer with the ability not only to distribute complex functionality throughout a dense integrated circuit, but to repair and enhance that functionality through late mask programming techniques.

Tiled Logic Gates Using the Cirrus CMOS Cell Set

Figure 3:
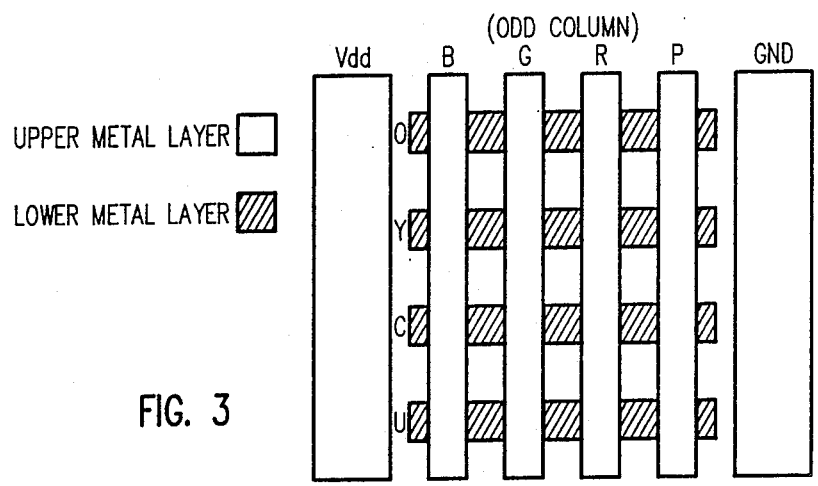
FIG. 3 illustrates the SLA template "grid", one or more of which is utilized to map each tile onto the SLA structure.

The individual tiles of the Cirrus CMOS Cell Set are each mapped onto one or more grids of a storage logic array. A typical grid is illustrated in FIG. 3 (although the basic grid can, of course, be varied in other embodiments of this invention).

In the odd column, the grid consists of four horizontal signal wires, O (Orange), Y (Yellow), C (Cyan) and U (Umber) on the lower metal layer, four vertical signal wires, B (Blue), G (Green), R (Red) and P (Purple), on the upper metal layer, and power Vdd and ground GND wires running vertically along the left and right edges, respectively. In even columns, the vertical wires (B, G, R and P) and the power Vdd and ground GND wires are reversed (i.e., from left to right, GND, P, R, G, B and Vdd).

The grid is designed such that one grid overlaps with the next adjacent grid in the same row, enabling the sharing of power Vdd and ground GND wires between adjacent grids. The basic philosophy of building wires in the Cirrus CMOS Cell Set is that each tile (including the one or more grids upon which that tile is mapped) provides the necessary "wire pieces" within that tile.

When individual tiles are tiled together (or when one tile occupies multiple grids), the wire pieces do not form one continuous wire, but actually leave small gaps at the interface between tiles and/or grids. Small pieces of wires, known as "joins", fill in these gaps. This technique greatly facilitates the process of modifying (whether repairing or enhancing) previous designs utilizing software design tools.

Thus, individual tiles of the Cirrus CMOS Cell Set each occupy one or more grids of a storage logic array. Logic gates, for example, are constructed by tiling together individual subgate tiles, rather than by designing a custom gate. This approach provides far greater flexibility not only for the design but for the subsequent modification of integrated circuits.

Figure 4A:
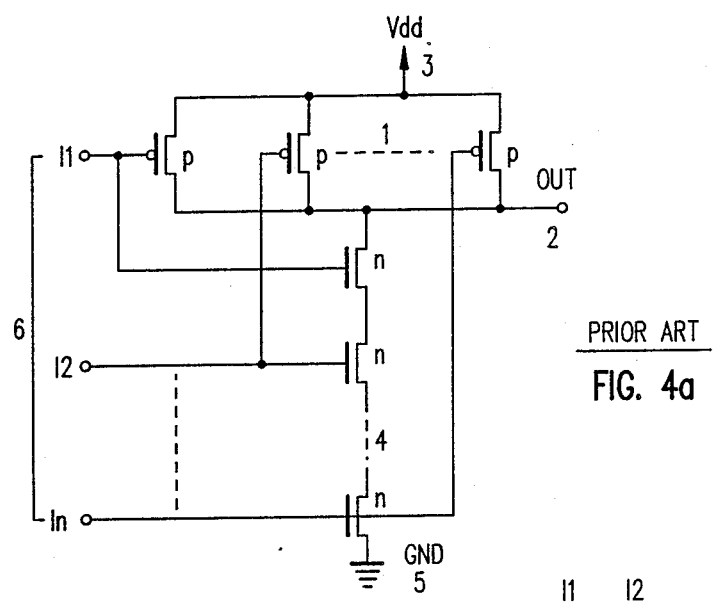
FIGS. 4a and 4b illustrate a typical n-input static CMOS NAND gate circuit and its standard cell layout, respectively.

Consider the example of a static CMOS NAND gate. A typical circuit schematic of an n-input static CMOS NAND gate is illustrated in FIG. 4a. Note that the gate consists of a set of p-channel transistors 1 (with the drain of each such transistor tied together to the output wire 2, and the sources connected to the power wire (Vdd) 3) and a series of n-channel transistors 4 (with one end of the series connected to the output wire 2 and the other end connected to the ground wire (GND) 5) Each input (I1–In) 6 to the gate is connected to one p-channel and one n-channel transistor gate.

Figure 4B:
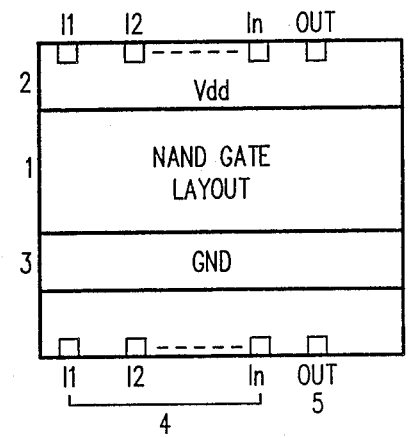

A typical layout footprint of a hand-crafted (standard cell) and lumped construction of this n-input static CMOS NAND gate is illustrated in FIG. 4b. The gate functionality is lumped into a rectangular area 1, with the power 2, ground 3, inputs 4 and output terminal 5 brought out at the periphery of the block.

The n-input static CMOS NAND gates constructed in this manner would require a customized design for each value of "n". Moreover, changes to that design, such as converting a three-input gate to a four-input gate, would require an entirely new cell layout.

Figure 5A:
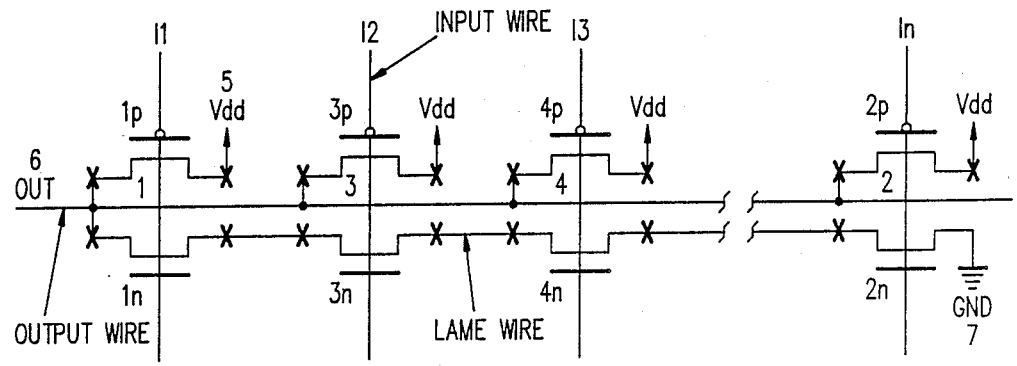
FIGS. 5a and 5b illustrate the circuit/layout schematic of n-input Cirrus CMOS Cell Set horizontal and vertical NAND gates, respectively.
Figure 5B:
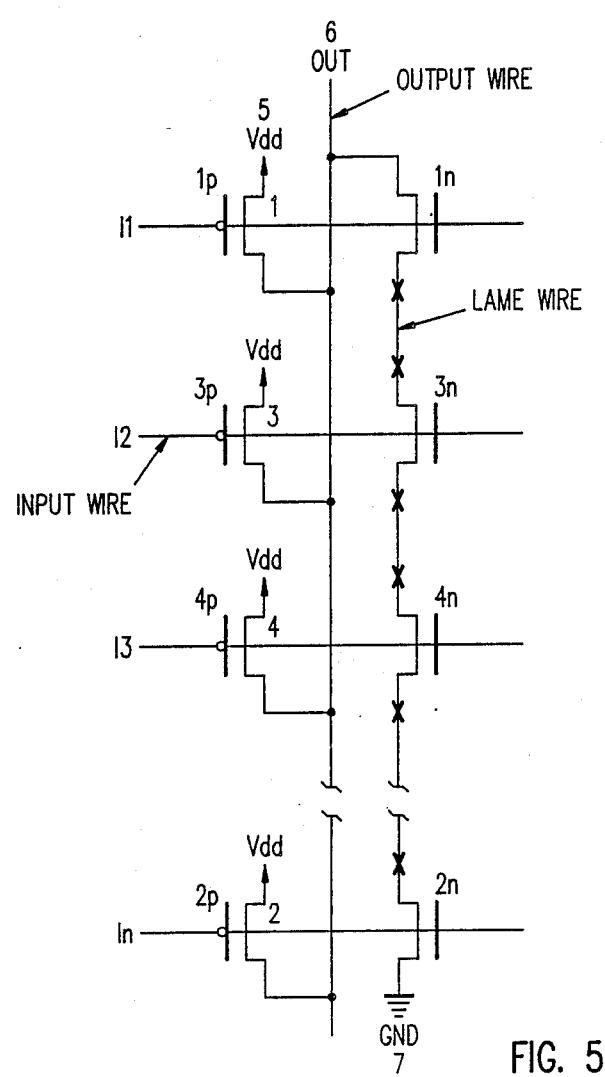
Figure 6A:
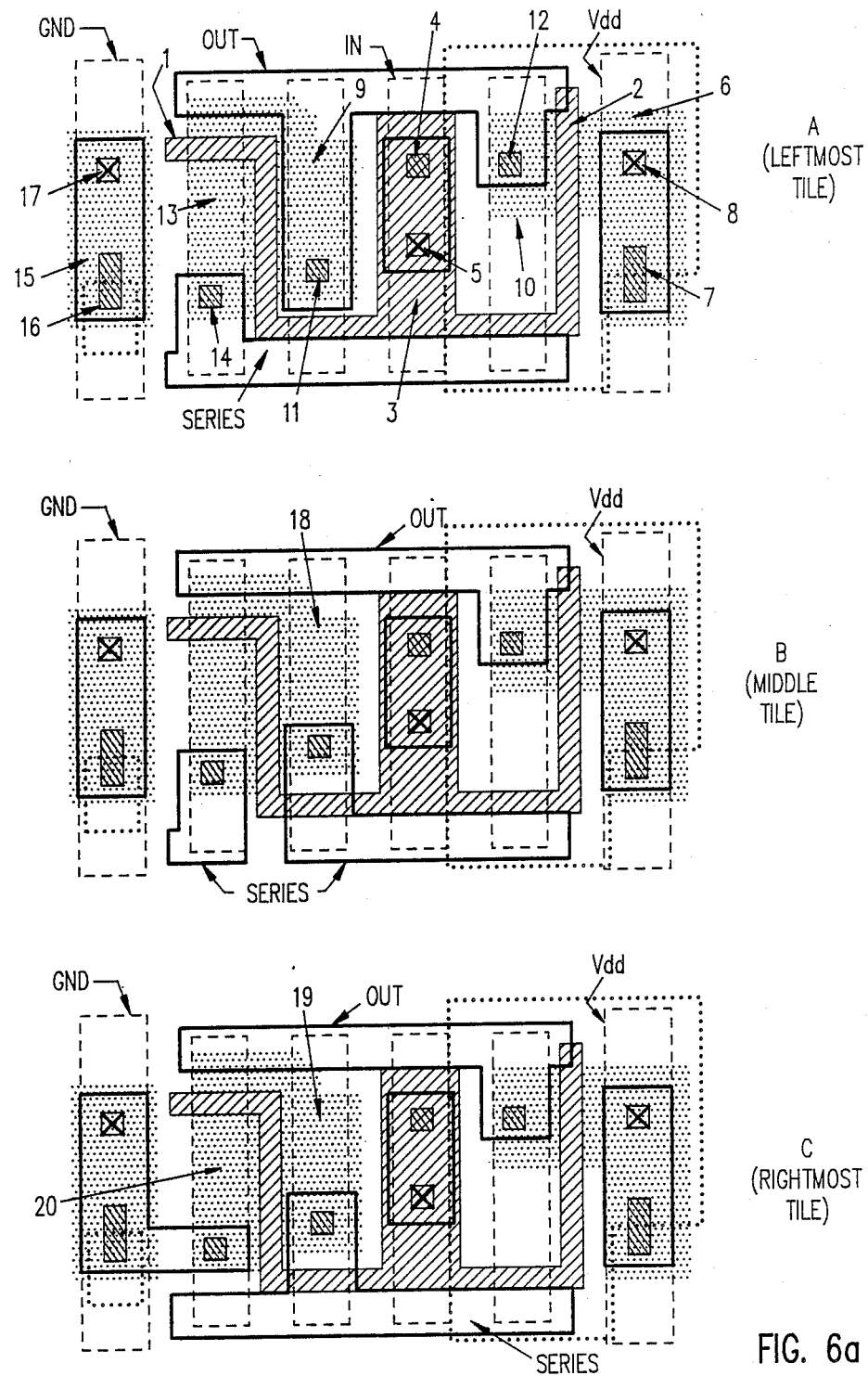
FIG. 6 illustrates how, by mere metal and via mask changes, a horizontal sub-NAND gate tile can be transformed among any of five different tile orientations, thereby enabling the creation of arbitrary n-input horizontal NAND gates.
Figure 6B:
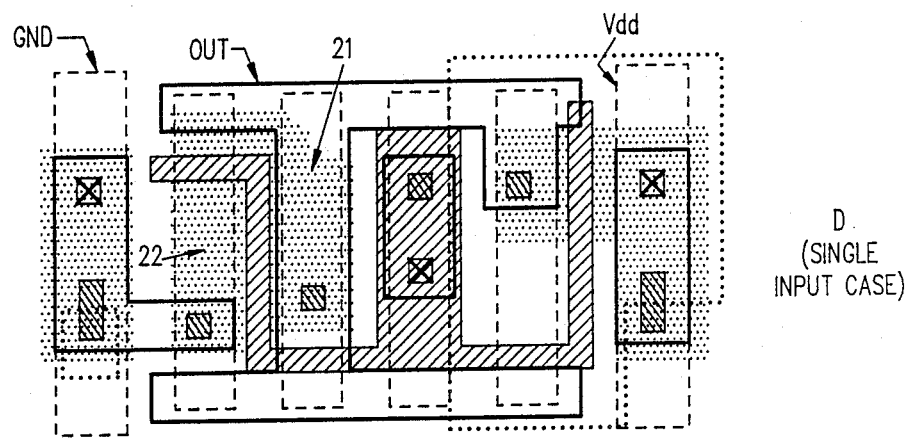
Figure 6B:
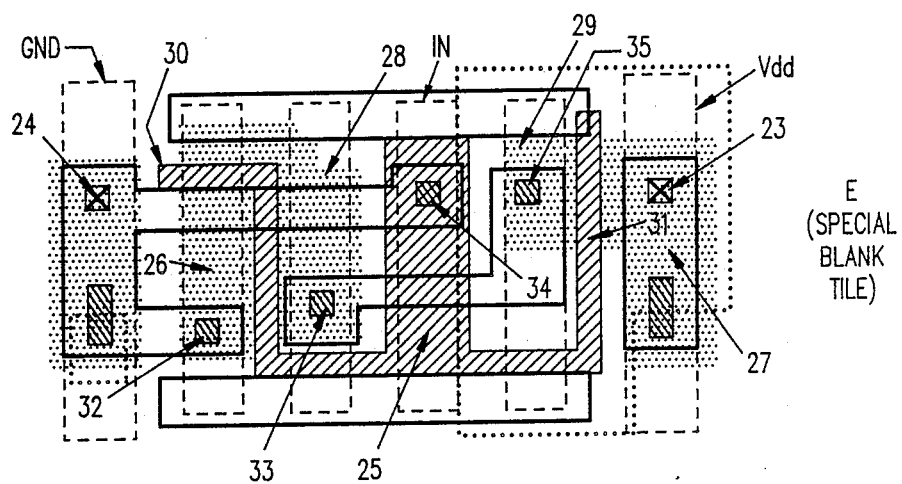
Figure 6B:
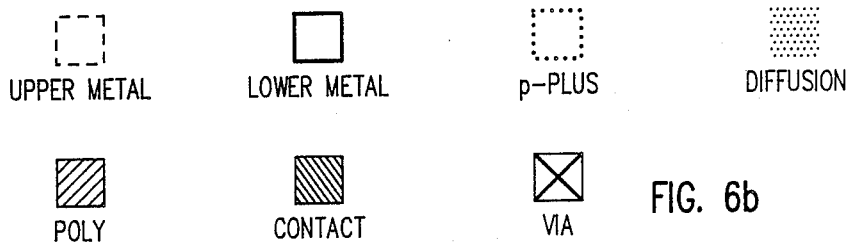

Using the Cirrus CMOS Cell Set, however, far greater flexibility is permitted for both the design and subsequent modification of such a gate. FIGS. 5a and 5b illustrate how horizontal and vertical n-input static CMOS NAND gates are constructed, respectively, using subgate tiles of the preferred embodiment of this invention.

These subgate tiles take advantage of the fact that a common component of static CMOS NAND gates is the pairing of one n-channel and one p-channel transistor. Thus, each subgate tile contains one n-channel and one p-channel transistor. The only difference between the various horizontal sub-NAND gate tiles (discussed in greater detail below) is the interconnection of the sources and drains of these transistors to power, ground or I/O wires.

This division of logic gates into their components facilitates the tiling of these subgate tiles, by enabling the mask layers of these tiles to be identical, with the exception of the metal and via layers. Not only can one tile together the different subgate tiles of each class (e.g., horizontal NAND gates) to form arbitrary n-input logic gates, but one can also transform any such subgate tile into another subgate tile of the same class, merely by modifying the metal and via layers, via late mask programming.

FIG. 5a illustrates three different horizontal sub-NAND gate tiles of the Cirrus CMOS Cell Set. The n-p transistor pair 1 on the far left of FIG. 5a can be described as a "leftmost" horizontal sub-NAND gate tile, while the transistor pair 2 on the far right can be described as a "rightmost" horizontal sub-NAND gate tile, and the transistor pairs 3 and 4 in the middle as "middle" horizontal sub-NAND gate tiles. The underlying base layers of each of these tiles are identical, but one can create horizontal n-input NAND gates merely by modifying the metal and via layers.

The source of each p-channel transistor (1p, 3p, 4p and 2p from left to right) is connected to "power" (Vdd) 5, while the drain of each such transistor is connected to the logic gate's output wire 6. The transistor gates of each n-p transistor pair are connected together via the corresponding input wires, I1, I2, I3 and In.

Because the n-channel transistors must form a serial chain (i.e., to "ground" the output signal only if every n-channel transistor in the chain is "turned on" by a "high" input), the sources and drains of these transistors must be connected differently depending upon their position in the chain (leftmost, rightmost or middle).

At the ends of the chain, the drain of leftmost n-channel transistor In connects to the logic gate's output wire 6, and the source of rightmost n-channel transistor 2n connects to "ground" (GND) 7. The source of leftmost n-channel transistor In connects to the drain of the n-channel transistor immediately to its right in the chain. Similarly, the drain of rightmost n-channel transistor 2n connects to the source of the n-channel transistor immediately to its left in the chain.

The sources of middle n-channel transistors 3n and 4n are connected to the drains of the n-channel transistors immediately to their right in the chain, whereas their drains are connected to the sources of the n-channel transistors immediately to their left in the chain. These wires, along which signals are merely transferred from one transistor to the next transistor in the chain, are referred to as "lame" wires.

Thus, utilizing these three types of sub-NAND gate tiles, one can construct n-input horizontal NAND gates, merely by tiling (n−2) "middle" tiles in between a leftmost and a rightmost tile. To create a one-input NAND gate (i.e., an inverter), however, requires a fourth type of tile, the n-channel transistor of which has its source connected to ground and its drain connected to the output wire.

Moreover, a fifth type of tile, a special blank tile (described in greater detail below), enables the distribution of subgate tiles, and thus logic gate functionality, with arbitrary columnar position of each input. Even without utilizing special blank tiles, certain row or column conductor wires of an individual tile may be "free" to transmit signals along that tile to the next adjacent tile.

In essence, this set of tiles permits the construction of horizontal NAND gates of arbitrary logical and physical "spread". As will be explained below, the significant power and flexibility afforded by this "tiled functionality" approach enables the creation (and subsequent modification) not only of individual logic gates, but of extremely complex functions.

The vertical sub-NAND gate tiles illustrated in FIG. 5b are virtually identical to those in FIG. 5a, except that the inputs are transmitted along horizontal wires and the output along a vertical wire. The orientation of the transistor pairs is, of course, aligned accordingly, requiring slightly different base mask layers. Although one cannot transform a horizontal sub-NAND gate tile into a vertical sub-NAND gate tile via late mask programming (at least in the current preferred embodiment), these two classes of tiles can be tiled together (as illustrated below) to form even "zigzag" NAND gates, as well as orthogonal structures, the functionality of which is distributed along rows and columns throughout the array.

Late Mask Programming of Individual "Tiles"

As discussed above, there are five distinct classes of horizontal sub-NAND gate tiles, the layout of each differing from that of the others with respect only to the metal and via mask layers. FIG. 6 illustrates the layout of each of these five classes (leftmost, middle, rightmost, inverter and special blank, respectively), including the metal and via layer connections unique to each class. Although three-layer (two metal and via) late mask programming is utilized in the preferred embodiment of this invention, comparable results might be achieved by modifying different combinations of mask layers (e.g., some or all of the uppermost four layers, including the layer connecting lower metal to the base layer on which transistor sources and drains are formed).

The layout symbology used in FIG. 6 is illustrated in the legend near the bottom of that figure. The different mask layers are represented by differently shaded symbols. The "Upper metal" rectangular regions are those vertical regions covered by thick dashed lines, while the "Lower metal" regions ate those horizontal regions represented by solid lines with no fill. The "Via" layer, which connects the upper and lower metal regions, is shown by dark boxes with no fill, while the "Contact" layer, which connects the lower metal and polysilicon/diffusion layers, is represented by the dark, solid filled boxes.

The actual transistors are formed by the polysilicon layer ("Poly"), which includes the transistor gate and is represented by the dark hatched areas, and by the diffusion layer ("Diffusion"), which includes the transistor source and drain and is represented by the light hatched areas.

The thin dashed lines ("p plus") represent the heavily doped p regions which form the source and drain of p-channel transistors. Thus, the transistors on the left side of each tile are the n-channel transistors, while the transistors on the right side are the p-channel transistors. The ground (GND) and power (Vdd) signals are shown running along the upper metal wires on the left and right sides, respectively, of each sub-NAND gate tile.

Looking at tile A in FIG. 6 (i.e., the leftmost sub-NAND gate tile of a horizontal NAND gate), it can be seen that the transistor gates 1 and 2 of the n-channel and p-channel transistors, respectively, are tied together by common polysilicon 3, which connects transistor gates 1 and 2 to the vertical upper metal input wire labeled "IN" for one of the NAND gate inputs, through contact 4 and via 5 connections. Connections 4 and 5 enable the input along that vertical upper metal wire to be transmitted to the transistor gates of both the n-channel and p-channel transistors of this leftmost sub-NAND gate tile (as is illustrated at the circuit level in FIG. 5a).

The p-channel transistor source 6 is connected to the vertical upper metal wire labeled "Vdd" through contact 7 and via 8 connections. The drains 9 and 10 of the n-channel and p-channel transistors, respectively, are each connected to the horizontal lower metal wire labeled "OUT", through contact connections 11 and 12, respectively. Finally, the n-channel transistor source 13 is connected to the horizontal lower metal wire labeled "SERIES", through a contact 14 connection. Note that, in this leftmost tile A, diffusion region 15, although connected to the vertical upper metal layer wire labeled "GND", through contact 16 and via 17 connections, is not connected to either the n-channel or p-channel transistors (but is used for connecting the "well" to a fixed biasing potential).

Now, comparing the other tiles illustrated in FIG. 6 with the leftmost tile, it can be seen that the only differences are in the source and drain connections of the n-channel transistor (as is also illustrated, at the circuit level, in FIG. 5a).

Thus, in tile B (a "middle" horizontal sub-NAND gate tile), instead of connecting the drain 18 of the n-channel transistor to the output wire (OUT), drain 18 is connected to the series wire (SERIES), which carries the signal from the adjacent sub-NAND gate tile on this tile's right to the adjacent sub-NAND gate tile on this tile's left.

In tile C (a "rightmost" horizontal sub-NAND gate tile), the n-channel transistor drain 19 is also connected to the series wire (SERIES), but, instead of also connecting the source 20 of that n-channel transistor to the series wire, source 20 is connected to the vertical upper metal layer ground wire (GND), to initiate the process in which a "low" signal is transmitted along the chain, to reach the output wire (OUT) only if all inputs are "high".

In tile D (a "one-input horizontal NAND gate"—i.e., an inverter), the drain 21 of the n-channel transistor is connected to the output wire (as in "leftmost" tile A), and the source 22 of that n-channel transistor is connected to the ground wire (as in "rightmost" tile C). Thus, if the one input is "high", the n-channel transistor will be activated (and the p-channel transistor will not), causing the ground signal (GND) to be transmitted to the output wire (OUT). Otherwise, if the one input is "low", the p-channel transistor will be activated (and the n-channel transistor will not), causing the power signal (Vdd) to be transmitted to the output wire (OUT). Thus, this one tile performs the function of a static CMOS inverter.

Finally, tile E (the "special blank" tile) is somewhat unique, in that it performs no active function unless it is modified (via late mask programming), but contains the same underlying base layers as the other horizontal sub-NAND gate tiles and can thus be transformed into any one of such tiles (if the appropriate enhancements or repairs are desired).

Moreover, if an active function is not desired, but rather, one desires simply to pass the signals from an adjacent tile along a row of the SLA so as to enable the distribution of NAND gate inputs along that row, then this tile is ideally suited for that task. Of course, the free conductor wires of any free conductor tile would be just as effective (in the event that such wires happen to be available).

Looking at this "special blank" tile, it can be seen that the only via connections 23 and 24 are to the power (Vdd) and ground (GND) wires, respectively. For example, no via exists between the input wire (IN) and the common 10 polysilicon 25 from which the transistor gates of the n-channel and p-channel transistors are formed.

The sources 26 and 27, of the n-channel and p-channel transistors are "initialized" to GND and Vdd, respectively. The drains 28 and 29 of these transistors are tied together, while the transistor gates 30 and 31 of these transistors are connected to the ground wire (GND). These connections effectively "initialize" both the n-channel and the p-channel transistors to an inactive state.

Yet, contact connections 32, 33, 34 and 35 are made, respectively, from the n-channel transistor source 26 and drain 28, common polysilicon 25 (in which the n-channel 30 and p-channel 31 transistor gates are formed) and p-channel transistor drain 29. With these connections already in place, additional via connections to upper metal wires will transform this "special blank" tile into any of the four other "active" horizontal sub-NAND gate tiles (normal subfunction tiles). Even if this transformation is not desired, all four upper metal and the top and bottom lower metal wires are available for use as "free" wires (to route signals from one adjacent tile to another).

Thus, FIG. 6 illustrates that any of the five horizontal sub-NAND gate tiles can be transformed into any other such tile via late mask programming. This degree of flexibility permits significant enhancements and repairs even to complex logic functions. In the control section of a microprocessor, for example, changing the position and number of inputs of certain logic gates effects significant functional changes. Examples of such complex modifications are illustrated below.

Illustrations of the Various Tile Classes of the Cirrus CMOS Cell Set

In addition to the class of horizontal NAND gates, the Cirrus CMOS Cell Set includes a number of other classes of logic (and even memory) tiles. Other tile classes of distributed subgate tiles are vertical NAND gates, and horizontal and vertical NOR gates (all of which are based on the same principle of dividing the gate elements into common active components, such as the n-p transistor pairs of the horizontal sub-NAND gate tiles).

Figure 7A:
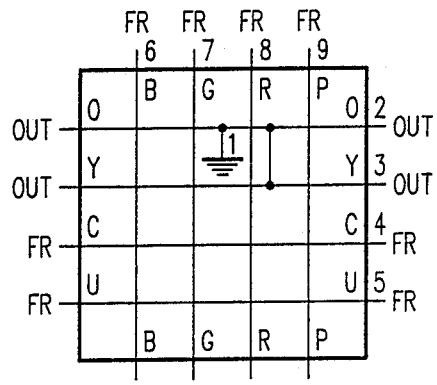
FIGS. 7a, 7b, 7c, 7d and 7e illustrate tiles of various tile classes in the Cirrus CMOS Cell Set (in addition to distributed logic subgate tiles), including, respectively, "connectivity and interface" tiles, "inverter" tiles, "transmission gate" tiles, "storage" tiles, and a relatively complex class of logic tiles, which perform the "exclusive NOR" (XNOR) function.

FIG. 7a illustrates the SLA template/circuit schematic of a tile of one of the classes of "connectivity and interface tiles", in which a single constant output (in this case, "ground") 1 is transmitted along two lower metal horizontal wires 2 and 3. What is significant about this relatively simple tile, in addition to the possible variations regarding the wire on which constant output signal 1 is transmitted, is the use of horizontal "free" wires 4 and 5, and vertical free wires 6, 7, 8 and 9, which enable the signals of particular tiles to be transmitted along rows and columns of the array to non-adjacent tiles, thus effecting a significant distribution of functionality.

Figure 7B:
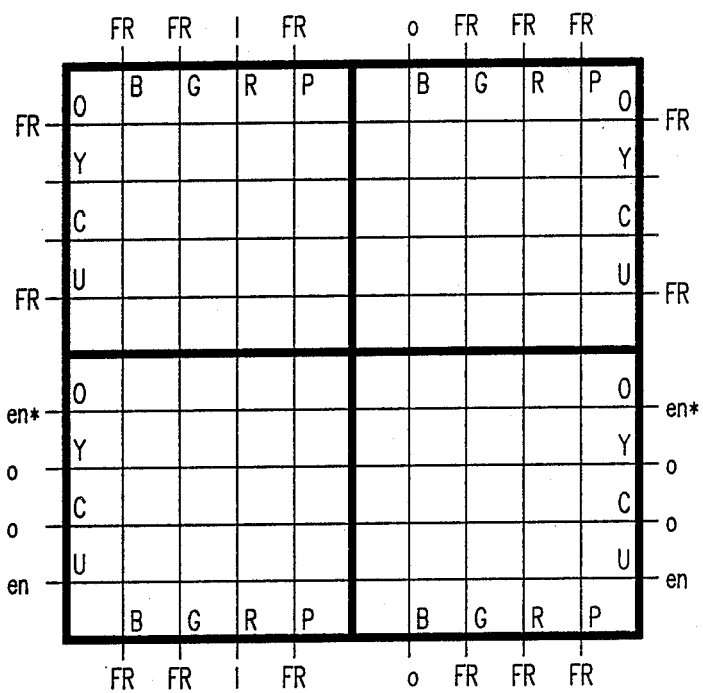
Figure 7B:
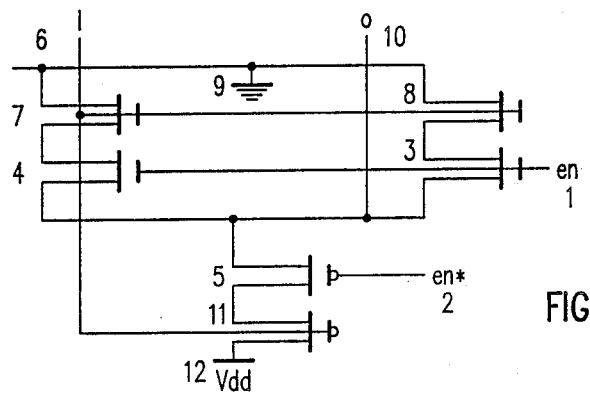

FIG. 7b illustrates both the SLA template and the corresponding circuit schematic of a tri-state inverter tile. Note that this one tile occupies four of the basic SLA grids, and includes a relatively large number of free wires, enabling this common tile to be placed frequently throughout an integrated circuit.

The logical tri-state is achieved if the enable signal 1 is "low" (and thus its complement 2 is "high") because neither n-channel transistors 3 and 4 nor p-channel transistor 5 is activated. If, however, enable signal 1 is "high", activating n-channel transistors 3 and 4, then a "high" input signal 6 will be inverted, by activating n-channel transistors 7 and 8, permitting "ground" signal 9 to flow to output 10. If input 6 is "low", that signal is inverted, by activating p-channel transistor 11, permitting power signal "Vdd" 12 to flow to output 10 (through p-channel transistor 5 which is activated by the "low" complement 2 of "high" enable signal 1).

Figure 7C:
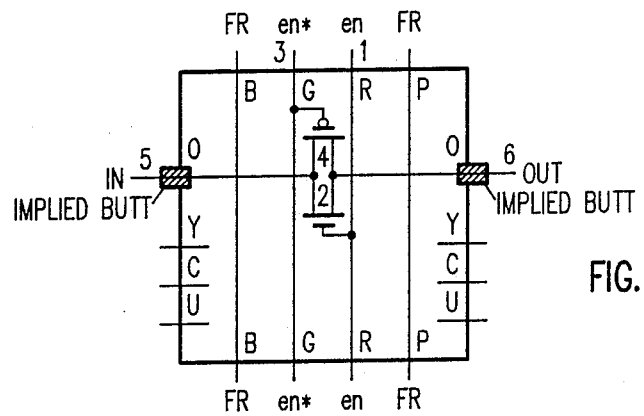

FIG. 7c illustrates the SLA template, and circuit schematic, of a tile of the class of "in-line horizontal transmission gate" tiles. This tile, which occupies only one SLA grid, provides a switch which, when enabled by enable signal 1, activating n-channel transistor 2 (while the complement 3 of enable signal 1 activates p-channel transistor 4), causes input signal 5 to pass through this tile and be transmitted as output signal 6. By setting enable signal 1 "low", neither n-channel transistor 2 nor p-channel transistor 4 will be activated, thus leaving output signal 6 unaffected. Thus, the state of enable signal 1 determines whether the switch will be "on" (allowing input signal 5 to flow through to output signal 6) or whether the switch will be "off" (preventing input signal 5 from flowing through to output signal 6). Note that this tile can function equally well as a transmission gate in the other direction (i.e., transmitting signal 6 into this tile and out again as signal 5).

Figure 7D:
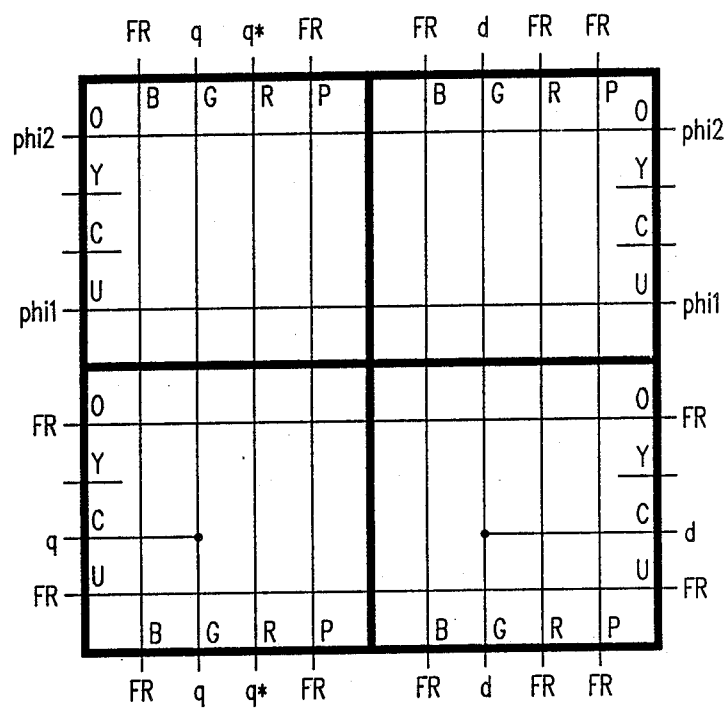
Figure 7D:
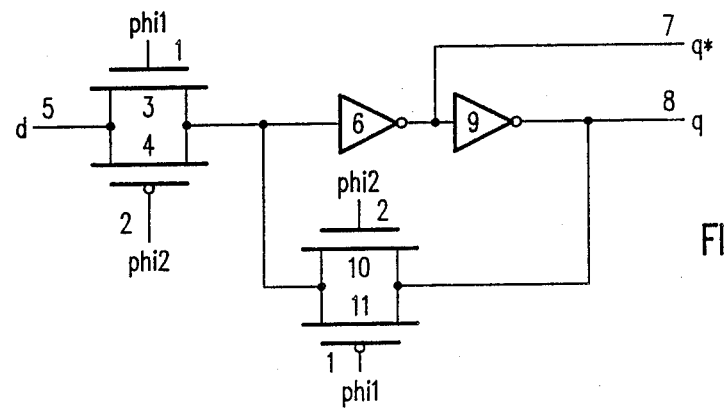

FIG. 7d illustrates both the SLA template and associated circuit schematic for one of the classes of storage tiles, a basic clocked "latch". Note that this tile occupies four SLA grids, and contains a relatively large number of free wires, to facilitate the tiling of this tile to an adjacent tile of another class, such as a subgate logic tile (which receives its input from the output of this latch and performs some logic function on that input). The ability to tile together tiles of different classes is a significant feature of the Cirrus CMOS Cell Set, explained in greater detail below.

This simple latch tile is controlled by a two-phase clock ("phi1" 1 and "phi2" 2) the operation of which is well known in the art. During the first phase (phi1) of the clock, both n-channel transistor 3 and p-channel transistor 4 are activated (because phi1 1 is "high" and phi2 2 is "low"), permitting input ("d") 5 to be "latched into" this tile, where it is inverted first by inverter 6 (and transmitted as the complement 7 of the output 8 of this latch—i.e., the complement of input 5), and then inverted back to its original state by inverter 9 and transmitted as the output 8 of this latch.

During the second phase (phi2) of the clock, however, this latch insures that output 8 (and its complement 7) is available, even if input 5 is no longer available. Neither n-channel transistor 3 nor p-channel transistor 4 is activated (because phi1 1 is "low" and phi2 2 is "high"), although n-channel transistor 10 and p-channel transistor 11 are both activated (because phi1 1 and phi2 2 are reversed, such that phi1 1 is transmitted to the transistor gate of a p-channel transistor, while phi2 2 is transmitted to the transistor gate of an n-channel transistor. Thus, output signal 8 "loops back" (during the second phase of the clock) through activated transistors 10 and 11, and through inverters 6 and 9. Thus, input 5 to this latch tile is "clocked" or "latched" in during the first phase phi1 1 of the clock, and "clocked" or "latched" out (as output signal 8 and its complement 7) during the second phase phi2 2 of the clock.

Note that output signal 8 and its complement 7 are available during phase phi1 (once stabilized). Yet, once phi1 goes "low" (and phi2 goes "high"), the latch becomes insensitive to changes in input 5.

Figure 7E:
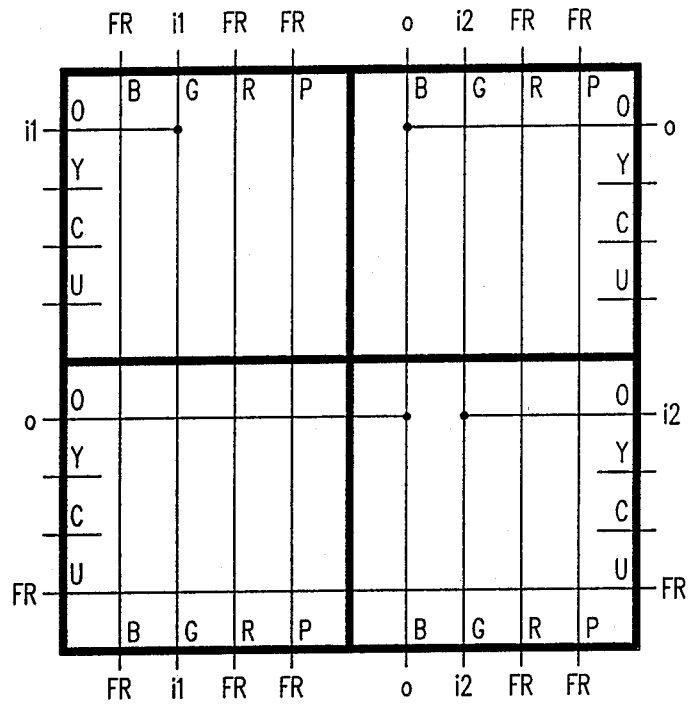
Figure 7E:
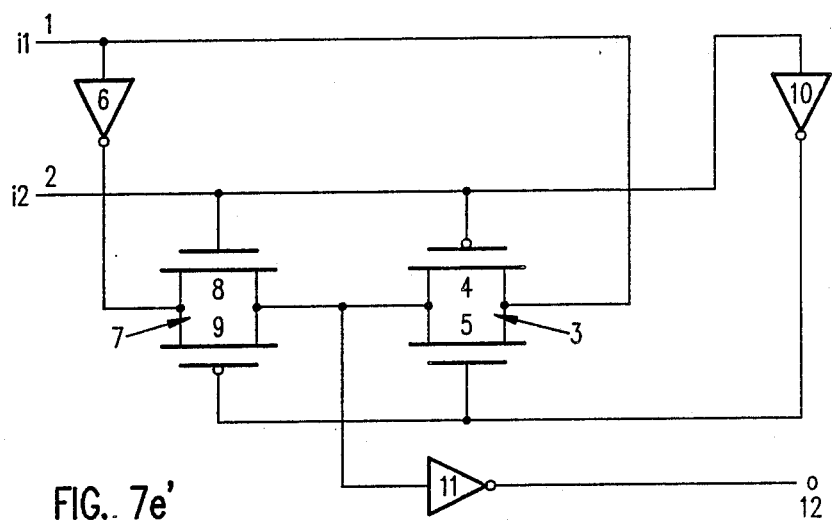

FIG. 7e illustrates a relatively complex class of tiles in the Cirrus CMOS Cell Set, which perform the "exclusive NOR" (XNOR) function. Note that this tile requires four SLA grids and, like many of the Cirrus CMOS Cell Set tiles, provides many free wires to facilitate placement of this tile in a variety of desired grid locations throughout the integrated circuit.

There are of course two inputs 1 and 2 to this tile. The first input 1 is sourced into the rightmost pair 3 of p-channel 4 and n-channel 5 transistors, while its complement (produced via inverter 6) is sourced into the leftmost pair 7 of n-channel 8 and p-channel 9 transistors. The second input 2 (and its complement, produced via inverter 10) determines whether transistor pair 3 or 7 is activated. If input 2 is "high", then the complement of input 1 passes through transistor pair 7, and is again inverted (via inverter 11) back to its original state, and is transmitted as the output 12 of this XNOR tile. If input 2 is "low", then input 1 passes through transistor pair 3, and is inverted, so that the complement of input 1 is transmitted as the output 12 of this XNOR tile. Thus, output 12 attains a "high" state only when inputs 1 and 2 are both "high" or both "low".

Distributed Logic Gates Using the Cirrus CMOS Cell Set

Figure 8A:
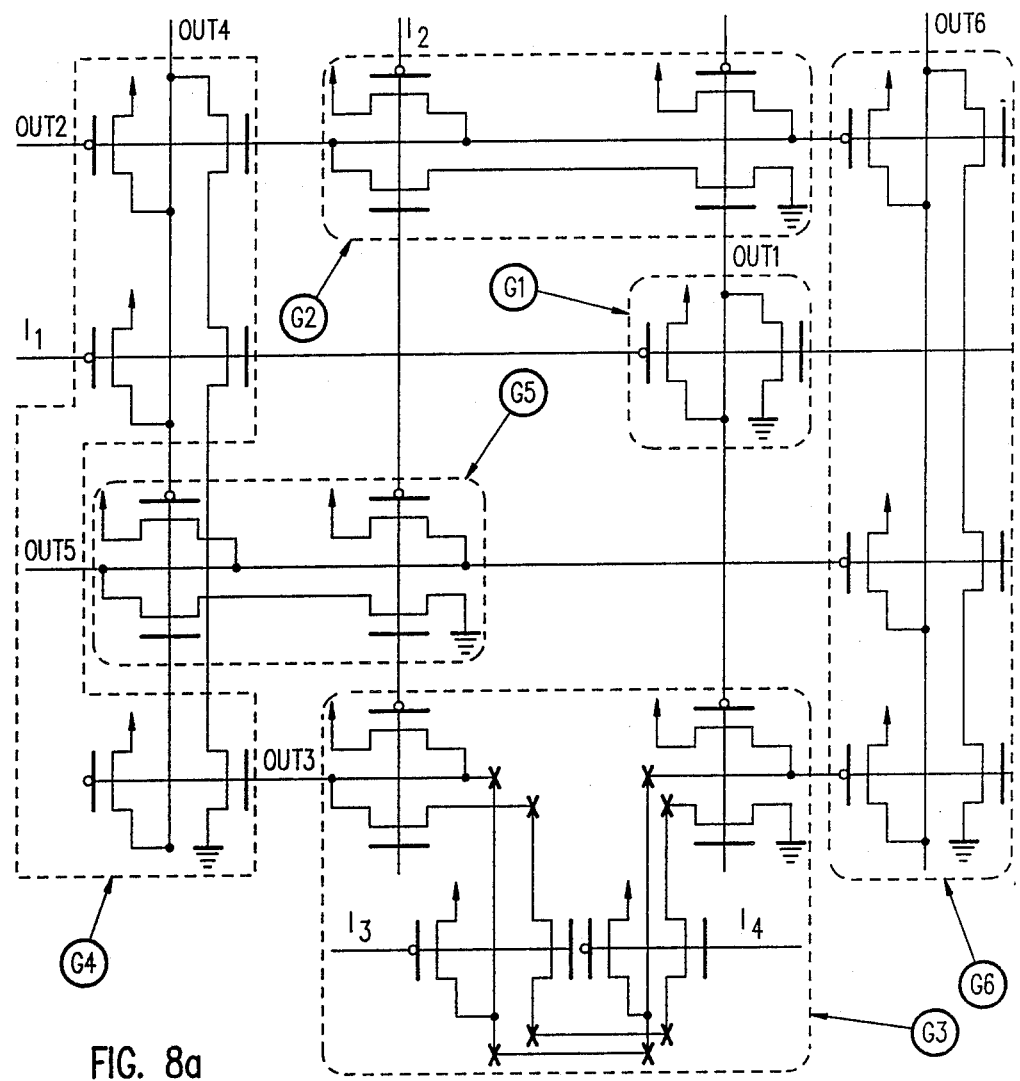
FIGS. 8a, 8b and 8c illustrate how, by utilizing two special tiles (a "blank" tile and an "ohmic" contact tile) along with the two classes of horizontal and vertical subNAND gate tiles, one can create multiple orthogonal logic gates as well as an individual logic gate whose inputs, outputs and active transistors are distributed along a particular SLA row or column, or throughout the array in a zigzag fashion. Illustrated are the circuit, logic and symbolic schematics, respectively.
Figure 8B:
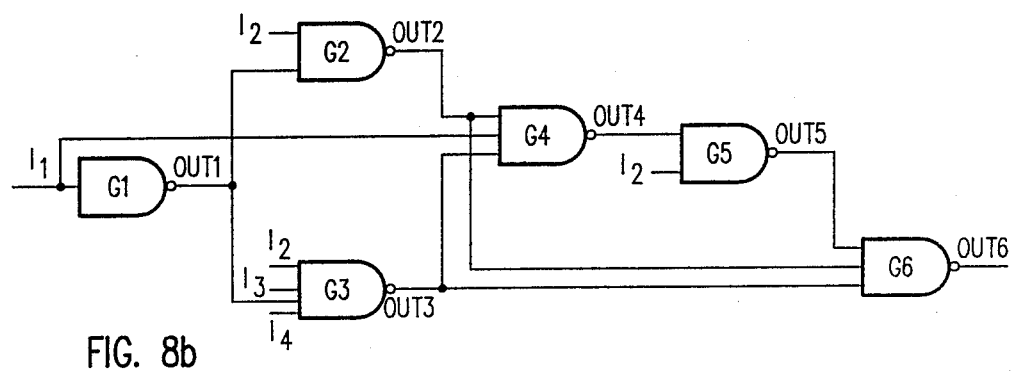
Figure 8C:
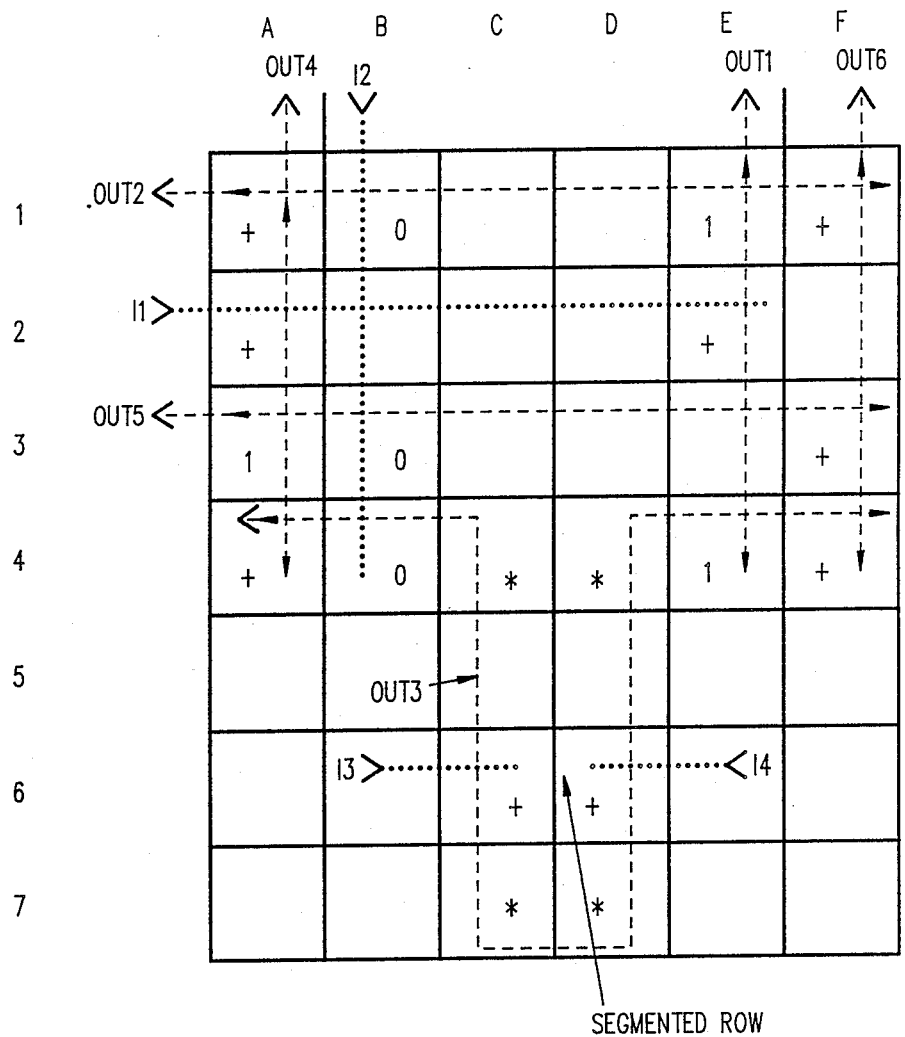

Returning to the notion of distributed logic gates, FIGS. 8a, 8b and 8c illustrate how the Cirrus CMOS Cell Set facilitates the almost arbitrary distribution, throughout the integrated circuit, of the functionality (in this example) of logical NAND gates. Such NAND gates can be distributed along part or all of a row of the SLA, with almost any desired column(s) left free to perform other logic and/or memory functions.

Moreover, an individual NAND gate need not be restricted to a single SLA row or column, but instead can "zigzag" along rows and columns in almost any fashion desired. The interconnection of multiple NAND gates (where, for example, the output of one NAND gate is one of the inputs to another NAND gate) can be implemented orthogonally (much like the pieces of a jigsaw puzzle) so as to limit the need for routing channels (much less dedicated, fixed-area routing channels) outside the individual tiles themselves.

Although the collective area occupied by the individual sub-NAND gate tiles themselves might not be quite as dense as a typical "standard cell" NAND gate, the flexibility for distribution of functionality inherent in the design of these tiles so reduces the relatively large area otherwise occupied by routing channels external to those "standard cells" that a significant increase in the overall density of the integrated circuit (comparable to that found in handcrafted custom designs) can be obtained. Moreover, these tiles also permit more optimal "mixing" of logic and storage functions which in turn reduces the need for routing channels.

FIG. 8b illustrates the logic schematic for the circuit illustrated in FIG. 8a. FIG. 8c illustrates the "tiling schematic" corresponding to that circuit. Although the logic in this example is relatively simple, it is apparent that the tiling approach implemented in the preferred embodiment of this invention will handle logic functions of greater complexity with equal ease. Moreover, as functions become more and more complex, the savings in routing area become more and more significant (and the slight extra area occupied by the individual tiles themselves becomes less and less significant).

Looking at both FIG. 8a and FIG. 8b, it can be seen that logical NAND gate G1 consists of only one tile and is, in essence, an inverter. Input signal I1 is inverted by activating, as discussed above, either the n-channel transistor of NAND gate G1, if I1 is "high" (causing the source "ground" signal to be transmitted as output OUT1), or the p-channel transistor, if I1 is "low" (causing the source "power" signal to be transmitted as output OUT1). Signal OUT1 is then transmitted as an input both to two-input NAND gate G2 and to four-input NAND gate G3.

Output signal OUT2 of NAND gate G2 is "low" when both inputs OUT1 and I2 (to the transistor gates of both n-channel and both p-channel transistors of gate G2) are "high", deactivating both p-channel transistors, and activating both n-channel transistors, in turn causing the "ground" signal to be transmitted as output signal OUT2.

Output signal OUT2 of NAND gate G2 is "high" when either input OUT1 or input I2 is "low", breaking the serial chain of the n-channel transistors of gate G2 (preventing the "ground" signal from passing through either one or both of those transistors), and activating either or both of the p-channel transistors of gate G2, causing the "power" signal to be transmitted as output signal of OUT2.

As mentioned above, signal OUT1 is also transmitted as an input to four-input NAND gate G3. The functions of NAND gates G2 and G3 are very similar, although NAND gate G3 contains two "middle" tiles to account for the extra (third and fourth) inputs not found in NAND gate G2.

Output signal OUT3 of NAND gate G3 is "low" when all four inputs I2, I3, OUT1 and I4 (to the transistor gates of the four corresponding n-channel transistors of gate G3) are "high", deactivating all p-channel transistors and activating all n-channel transistors of gate G3, in turn causing the "ground" signal to be transmitted as output signal OUT3.

Output signal OUT3 of NAND gate G3 is "high" when any of the four inputs I2, I3, OUT1 or I4 is "low", breaking the serial chain of the n-channel transistors (preventing the "ground" signal from passing through any or all of those four n-channel transistors), and activating one of the four p-channel transistors, causing the "power" signal to be transmitted as output signal OUT3.

Thus, vertical NAND gate G1 (a one input inverter) is orthogonal to both two-input horizontal NAND gate G2 (sharing column wire signal OUT1, which is both the output of NAND gate G1 and an input to NAND gate G2) and four-input horizontal NAND gate G3 (sharing column wire signal OUT1 which is both the output of NAND gate G1 and an input to NAND gate G3). Note that orthogonal gates need not (but may be) adjacent, as are NAND gates G1 and G2. They can be separated by blank or normal subfunction tiles (through "free" wires), as are NAND gates G1 and G3. They can even overlap orthogonally (tiling together like pieces of a jigsaw puzzle), as illustrated below with gates G4 and G5.

The designer has a significant degree of flexibility with respect to the actual placement of individual functions, including the almost arbitrary distribution of the functional components (e.g., subgate tiles) of such more complex functions. NAND gate G3, for example, is a "zigzag" gate, containing both horizontal and vertical sub-NAND gate tiles.

Normally, horizontal and vertical subfunction tiles will result in multiple orthogonal functions, with the output of one function feeding into the input of the orthogonally disposed function. With the use of "ohmic" tiles, however, it is possible to "bend" wires such that the "lame" wire (extending the signal along the series of n-channel transistors) coming into the ohmic tile can be output at a right angle, enabling a single gate to "zigzag" along virtually any row and column of the array.

In the example illustrated in FIG. 8a, input I2 to NAND gate G3 enters a horizontal sub-NAND gate tile the signals of which are routed through an ohmic tile into a vertical sub-NAND gate tile, which receives input I3. Two additional ohmic tiles enable the transfer of that tile's signals across arrow of the array and back up to another vertical sub-NAND gate tile in the next column (receiving input I4), whereupon another ohmic tile bends the output signals of that tile and transfers them into the "rightmost" horizontal sub-NAND gate tile (receiving input OUT1).

Thus, individual NAND gate G3 contains four sub-function tiles, distributed (in a zigzag fashion) along four rows and four columns of the array. Such flexibility permits significant variation in the placement of gate inputs and outputs, as is apparent from the various rows and columns in which inputs I2, I3, OUT1 and I4, and output OUT3, are located The sub-NAND gate tiles are thus extremely compatible with tiles of other classes, such as flip flops as well as other memory and logic functions with which NAND gate logic is utilized.

Vertical NAND gate G4 has three inputs—I1 (which is also an input to NAND gate G1), and the outputs, OUT2 and OUT3 of NAND gates G2 and G3, respectively.

Output signal OUT4 of NAND gate G4 is "low" when all three inputs I1, OUT2 and OUT3 (to the transistor gates of the n-channel and p-channel transistor pairs associated with each of the three inputs) are "high", deactivating all three p-channel transistors, and activating all three n-channel transistors, in turn causing the "ground" signal to be transmitted as output signal OUT4.

Output signal OUT4 of NAND gate G4 is "high" when any of the three inputs I1, OUT2 and OUT3 is "low", breaking the serial chain of the three n-channel transistors (preventing the "ground" signal from passing through any or all of those three n-channel transistors), and activating one of the three p-channel transistors, causing the "power" signal to be transmitted as output signal OUT4.

The leftmost tile of two-input horizontal NAND gate G5 not only lies in the very same row along which output signal OUT5 of NAND gate G5 (which is an input to vertical NAND gate G6) is transmitted, but directly in between two tiles of NAND gate G4.

Output signal OUT5 of NAND gate G5 is "low" when both inputs OUT4 and I2 (to the transistor gates of the n-channel and p-channel transistor pairs associated with each of the two inputs) are "high", deactivating both p-channel transistors, and activating both n-channel transistors, in turn causing the "ground" signal to be transmitted as output signal OUT5.

Output signal OUT5 of NAND gate G5 is "high" when either input OUT4 or input I2 is "low", breaking the serial chain of both n-channel transistors (preventing the "ground" signal from passing through either one or both of those transistors), and activating either or both p-channel transistors, causing the "power" signal to be transmitted as output OUT5.

In contrast to the "T" formation of orthogonal NAND gates G4 and G5, the output signal OUT5 of NAND gate G5 is distributed across a row of the array, passing through two columns of tiles before reaching the middle tile of three-input vertical NAND gate G6, to which it is orthogonal. NAND gate G3, on the other hand, is (in a sense) orthogonal both to NAND gate G4 and to NAND gate G6, but lies in between these two gates along the row on which its output OUT3 is transmitted.

NAND gate G6 is also distributed along the column on which output OUT6 is transmitted, leaving a blank tile along the row upon which signal I1 is transmitted. Note that this tile need not be blank, but could be any "free conductor" tile (described above), such as a "special blank" tile (which, if necessary could be transformed, by late mask programming, into another sub-NAND gate tile) or any other tile (whether a sub-NOR gate tile or a flip flop) which contains a free column conductor permitting output signal OUT6 to be transmitted through that free conductor tile.

Output signal OUT6 of NAND gate G6 is "low" when all three inputs OUT5, OUT2 and OUT3 (to the transistor gates of the three n-channel transistors associated with these three inputs) are "high", deactivating all three p-channel transistors, and activating all three n-channel transistors, in turn causing the "ground" signal to be transmitted as output signal OUT6.

Output signal OUT6 of NAND gate G6 is "high" when any of the three inputs OUT5, OUT2 or OUT3 is "low" (preventing the "ground" signal from passing through any or all of those three n-channel transistors), and activating one or more of the three p-channel transistors, causing the "power" signal to be transmitted as output signal OUT6.

Thus, the circuitry in FIG. 8a, and its associated logic schematic in FIG. 8b, illustrate that the Cirrus CMOS Cell Set tiling approach enables the distribution of NAND gate functionality not only along a row or column of the array (via "blank" or other tiles containing free wires), but also (in a zigzag fashion) both along virtually any row and any column. Add to that the capability of multiple orthogonal gates (the output of one gate feeding into the input of another orthogonally disposed gate), and it becomes apparent that NAND gate functionality (as well as more complex functions) can be distributed almost arbitrarily throughout the integrated circuit. Gate (or function) inputs and outputs can be placed along almost any row or column of the array, as can the actual subfunction elements (tiles) themselves.

Interconnected gates can be tiled together orthogonally, and individual gates can "zigzag" along rows and columns (with the use of ohmic tiles, as illustrated above). These functions can then be isolated in distinct portions (i.e., modules) of the SLA. As connections among these isolated functions are required, individual gates, and even subgate tiles, can be moved to different rows and columns of the SLA (further distributing functionality) so as to facilitate such connections.

FIG. 8c illustrates how a logic designer might actually create the SLA layout of the logic illustrated in FIG. 8b, utilizing software to aid in the transformation of storage logic array grids, comprised of Cirrus CMOS Cell Set tiles, into an actual digital database layout. Inverter G1 is comprised of only one vertical sub-NAND gate tile E-2, the output OUT1 of which is fed into tile E-1 of horizontal NAND gate G2, and into tile E-4 of zigzag NAND gate G3.

NAND gate G2 is distributed along row 1 so that it may share input I2 (in column B) with horizontal sub-NAND gate tile B-3 of horizontal NAND gate G5 and with horizontal subNAND gate tile B-4 of zigzag NAND gate G3. The output of horizontal NAND gate G2 is fed as an input into vertical sub-NAND gate tile A-1 of vertical NAND gate G4 and into vertical sub-NAND gate tile F-1 of vertical NAND gate G6.

NAND gate G3 zigzags along four columns and four rows by using ohmic tile C-4 to transfer the n-channel transistor series and output signals of horizontal sub-NAND gate tile B-4 to vertical sub-NAND gate tile C-6, and using ohmic tiles C-7 and D-7 to transfer those signals further to vertical sub-NAND gate tile D-6 and, finally, using ohmic tile D-4 to transfer those signals to "rightmost" horizontal sub-NAND gate tile E-4, completing this eight-tile, four-input zigzag NAND gate (distributed along four columns and four rows).

Zigzag NAND gate G3 illustrates the significant degree of flexibility, with respect to the distribution of functionality, provided by the Cirrus CMOS Cell Set. Functionality (whether of gates or more complex functions) can be distributed throughout virtually any row and column of the integrated circuit array, enabling maximum flexibility with respect to the placement of input and output signals, as well as the placement of the active subfunction elements (tiles) themselves.

Vertical NAND gate G4 illustrates another example of the orientation of multiple orthogonal gates. Whereas NAND gates G1 and G2 achieve their orthogonal orientation by the placement of adjacent tiles E-2 (of gate G1) and E-1 (of gate G2), NAND gates G4 and G5 fit together orthogonally as do the pieces of a jigsaw puzzle, with tile A-3 (of gate G5) "inserted" in between tiles A-2 and A-4 (of gate G4). Such an orientation enables tile B-3 of two-input horizontal NAND gate G5 to share input I2 with gate G-3 while the other tile A-3 of gate G5 receives, orthogonally, output OUT4 (of gate G4).

The output of horizontal NAND gate G5 is then fed, across row 4, as an input to vertical three-input NAND gate G6, the final output of which is transmitted along column F of the array.

Although there are many tile layouts, in addition to the one illustrated in FIG. 8c, which implement the logic diagrammed in FIG. 8b, what is significant is that, by utilizing the Cirrus CMOS Cell Set, the designer has a great deal of flexibility with respect to the placement of subfunction tiles. If a particular gate does not quite line up in the array, the designer need merely insert a blank tile to move a piece of that gate further along a row or column, or use an ohmic contact tile to "bend" that gate around another gate lying in its path. It is thus apparent that this invention significantly reduces the limitations of the array structure itself, which currently make the design of complex PLA and PAL logic designs quite difficult.

It should also be noted that, by mapping Cirrus CMOS Cell Set tiles onto an SLA template, the segmentation of rows and columns provides the ability not only to distribute functionality, but also to isolate functionality. For example, returning to FIG. 8c, note that output OUT3 of gate G3 does not extend fully along row 4. Instead, ohmic contact tiles C-4, C-7, D-7 and D-4 permit that signal to be "bent" down column C and back up column D, until it can again continue along row 4.

Moreover, ohmic contact tiles are only one means of bending rows and columns to permit a particular function (whether an individual gate or a more complex function, such as an ALU) to be isolated electrically from another function to which it may or may not be connected (elsewhere in the circuit).

Distributing Complex Functionality With the Cirrus CMOS Cell Set

In addition to providing significant increases in density, via the tiling of subgate and more complex subfunction components, the Cirrus CMOS Cell Set also provides a significant degree of repairability (unlike traditional logic design and layout approaches which trade off either density or repairability). Whenever complex logic is designed, the need for various functional enhancements and repairs is inevitable. For example, a designer may discover that an additional signal input to a NAND gate is required in the control portion of a microprocessor, or that an entirely new condition is desired, requiring the "NANDing" of three new signals from an instruction decoder.

Such modifications cannot be made to a standard cell design without a significant alteration of the layout of the circuit itself, which almost certainly will require the redesign of the layout of various base mask layers. Even gate arrays, which can be modified solely by modifying metal and via mask layers, do not provide the significant flexibility afforded by the Cirrus CMOS Cell Set, because gate array changes require significant modifications to those uppermost layers, in contrast to the relatively minor late mask changes necessary, for example, to transform a "rightmost" sub-NAND gate tile into a "middle" sub-NAND gate tile. By simplifying these changes, this invention enables significant functional modifications to be made locally, without affecting performance of other, unmodified portions of the chip.

For example, a five-input NAND gate can be "split" into one two-input and one three-input NAND gate. Additional sub-NAND gate tiles can be connected to add input signals (e.g., to impose an additional condition under which a register is write-enabled). Entire gates, consisting of multiple tiles, can even be moved to different areas of the SLA, freeing up those gate resources to perform other desired functions which require resources as basic as, for example, NAND gates (provided that sufficient "special blank" tile resources are available).

Not only are these changes effected merely through modifications to metal and via mask layers, but they are implemented without requiring the addition of circuitous routing channels or, for that matter, any additional routing area outside of the individual tiles themselves. This is made possible by a number of factors, including the various "free" wires already provided within individual tiles, the ability to mix logic and storage functions within discrete, isolated sections of the array, and the ability to distribute functionality by moving subgate elements within a row or column of the SLA or even to multiple other rows and columns (leaving "holes" in the middle of gates, filled by other tiles which perform other, perhaps unrelated, functions).

Illustrated below are examples of how this distribution of functionality facilitates the design, and subsequent enhancement and repair, of complex functionality.

Figure 9A:
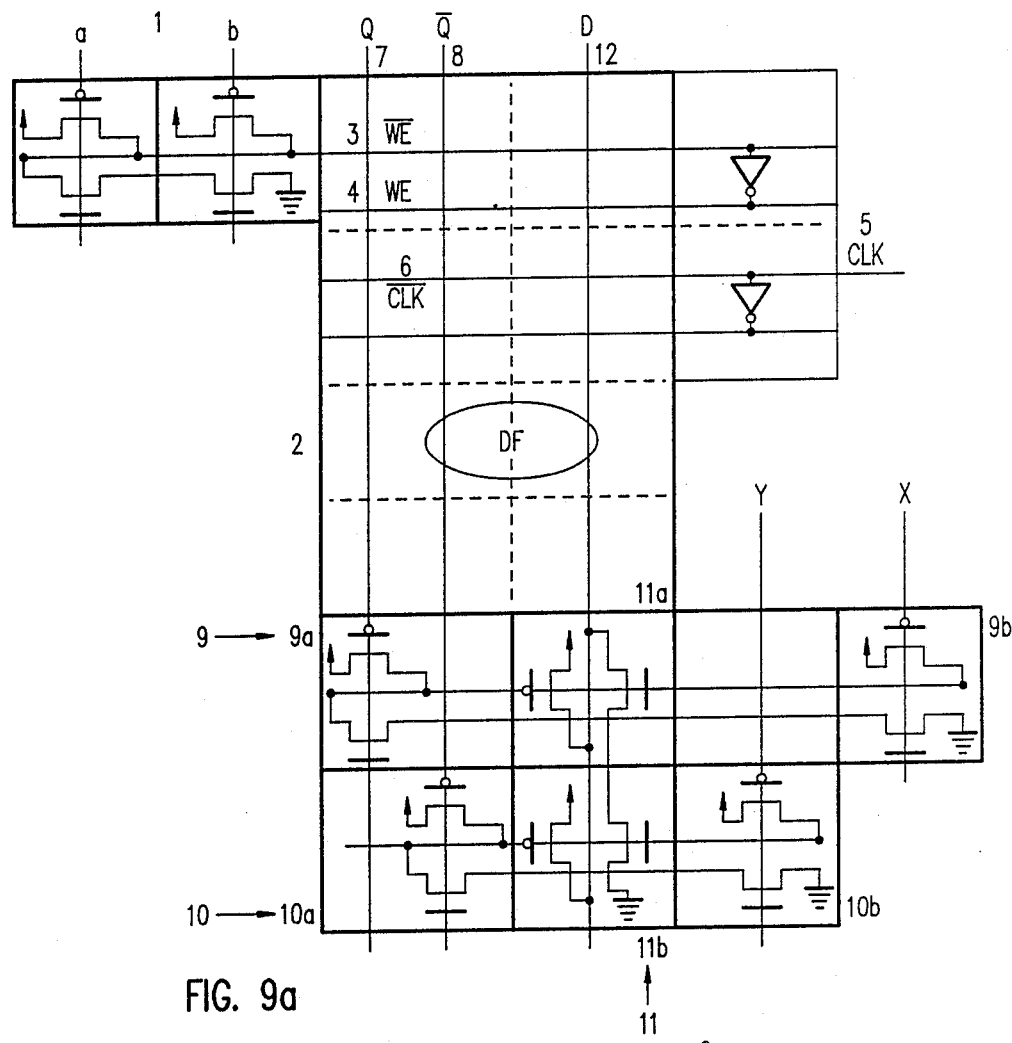
FIGS. 9a and 9b illustrate how complex functions can be designed by tiling together tiles among various classes of tiles, thereby distributing the inputs, outputs and active components of complex functions (not merely logic gates) throughout the SLA. Illustrated are the transistor and logic schematics, respectively.
Figure 9B:
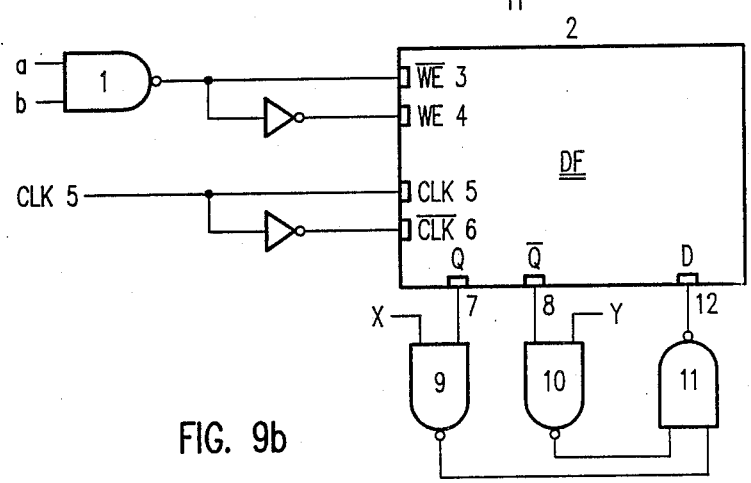

FIG. 9a illustrates the logic schematic for the circuit illustrated in FIG. 9b. It is quite common for the data outputs of a register, for example (consisting of n flip flops where n is the bit width of the register) to be fed into certain random logic for further processing, and then be fed back into the register to implement a sequential machine Rather than create dedicated routing channels between "standard cell" flip flop and logic modules, the flip flop and, for example, NAND gate tiles of the Cirrus CMOS Cell Set are designed to tile together without any routing in addition to that within the individual tiles themselves.

The two input horizontal NAND gate 1 in the top left corner of FIG. 9a, for example (receiving inputs a and b), determines the appropriate condition under which a register is to be write-enabled (e.g., when particular bits of a microinstruction indicate that the register is the destination of a particular macroinstruction). In the example illustrated in FIGS. 9a and 9b, two input signals a and b are "NANDed" together to determine whether D flip flop 2 is to be write-enabled. This NAND gate, however, butts directly up against (i.e., tiles to) flip flop 2, without requiring any routing channels.

If both inputs a and b are "high" then both n-channel transistors of gate 1 are activated (and, conversely, both p-channel transistors are deactivated), causing the "ground" signal to be transmitted as the complement 3 of write-enable signal 4, in turn causing flip flop 2 to be write-enabled. If either input a or input b is "low"-'however, then either of the p-channel transistors of gate 1 is activated (while both n-channel transistors are deactivated), causing the "power" signal to be transmitted as the complement 3 of write-enable signal 4, in turn causing flip flop 2 to be write-disabled.

The clock signal ("CLK") 5 and its complement 6, of course determine when data can be read from and written to flip flop 2. The output ("Q") 7 of flip flop 2, and its complement 8, also interface directly to random logic NAND gate 9 through tiling, and then NAND gate 10, so that further logic can be performed on those outputs (by "NANDing" them with signals "X" and "Y"respectively), the outputs of which are "NANDed" together by NAND gate 11 to generate the next input ("D") 12 to flip flop 2. Of course, any random logic can be tiled to flip flop 2 so as to generate the next state input based upon the current state output.

Looking at FIG. 9a, it is apparent once again that the Cirrus CMOS Cell Set embodiment of this invention effects a significant increase in density by permitting gates 9, 10 and 11 not only to be tiled to flip flop 2 without additional routing channels outside of those gate tiles, but to be distributed among themselves so as to share only two rows and four columns of the array. Horizontal NAND gate 9, comprised of tiles 9a and 9b, is distributed along the row also containing tile 11a of vertical NAND gate 11. The other tile of gate 11, tile 11b, is on the next row down, in between tiles 10a and 10b of horizontal NAND gate 10.

This placement of tiles illustrates the flexibility afforded the designer for placing random logic gates 9, 10 and 11 so as to "line up" with signals 7, 8 and 12 of flip flop 2. Thus, even "standard" tiles of different classes (such as sub-NAND gate tiles and flip flop tiles) can be tiled together to perform useful logic functions without requiring external routing channels.

Figure 10A:
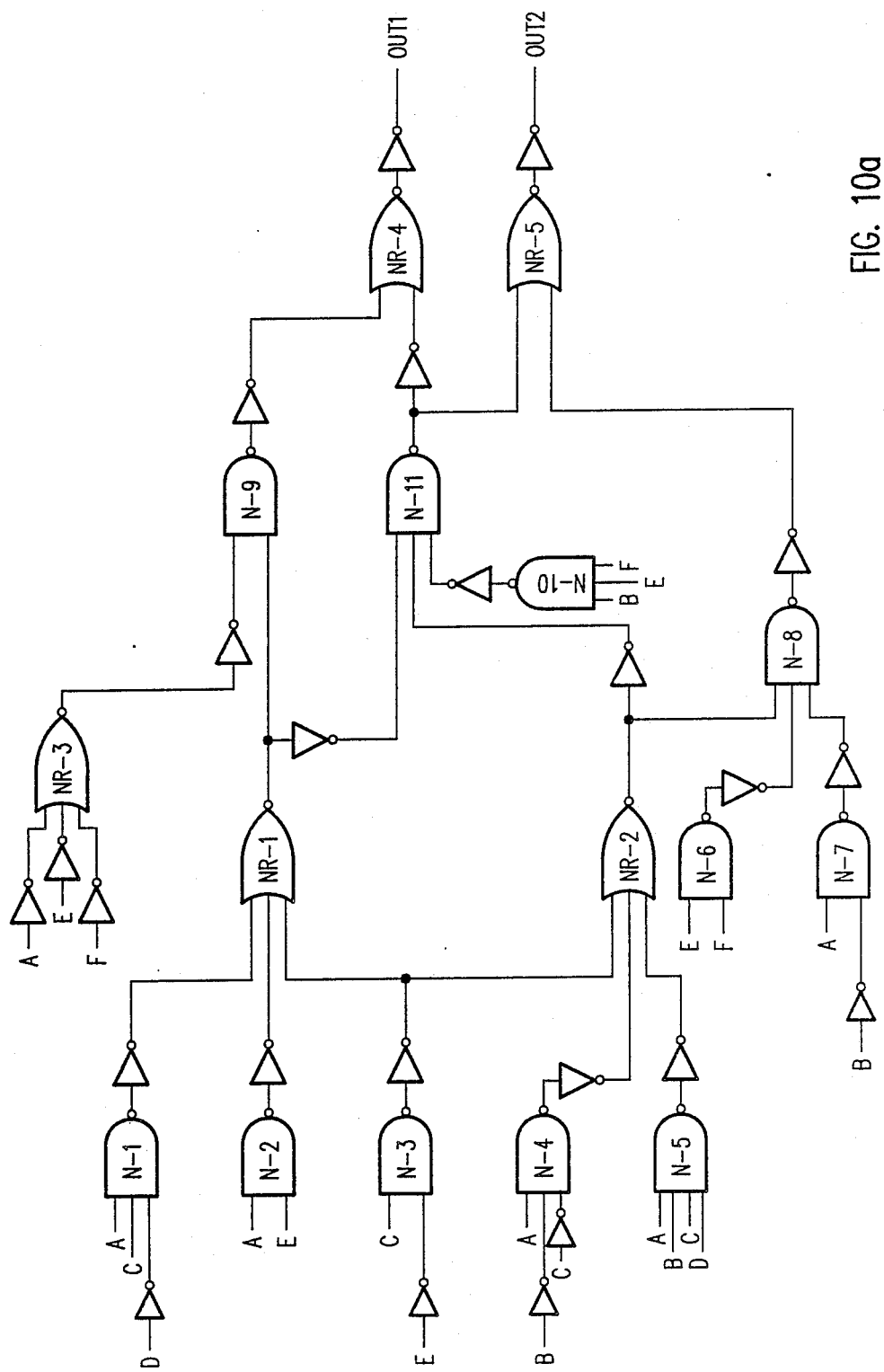
FIGS. 10a, 10b and 10c illustrate the logic schematic and two Cirrus CMOS Cell Set layout representations of a relatively complex combinational logic circuit.
Figure 10B:
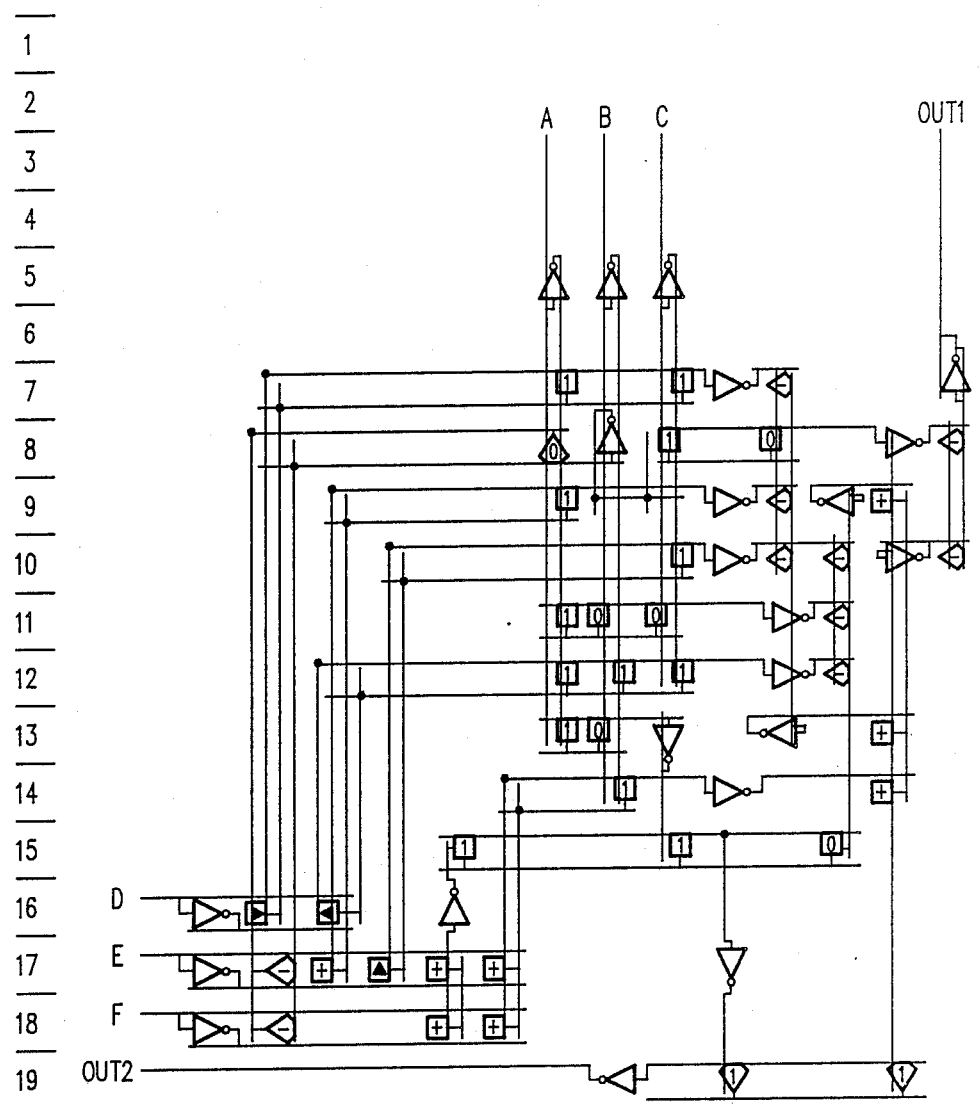
Figure 10C:
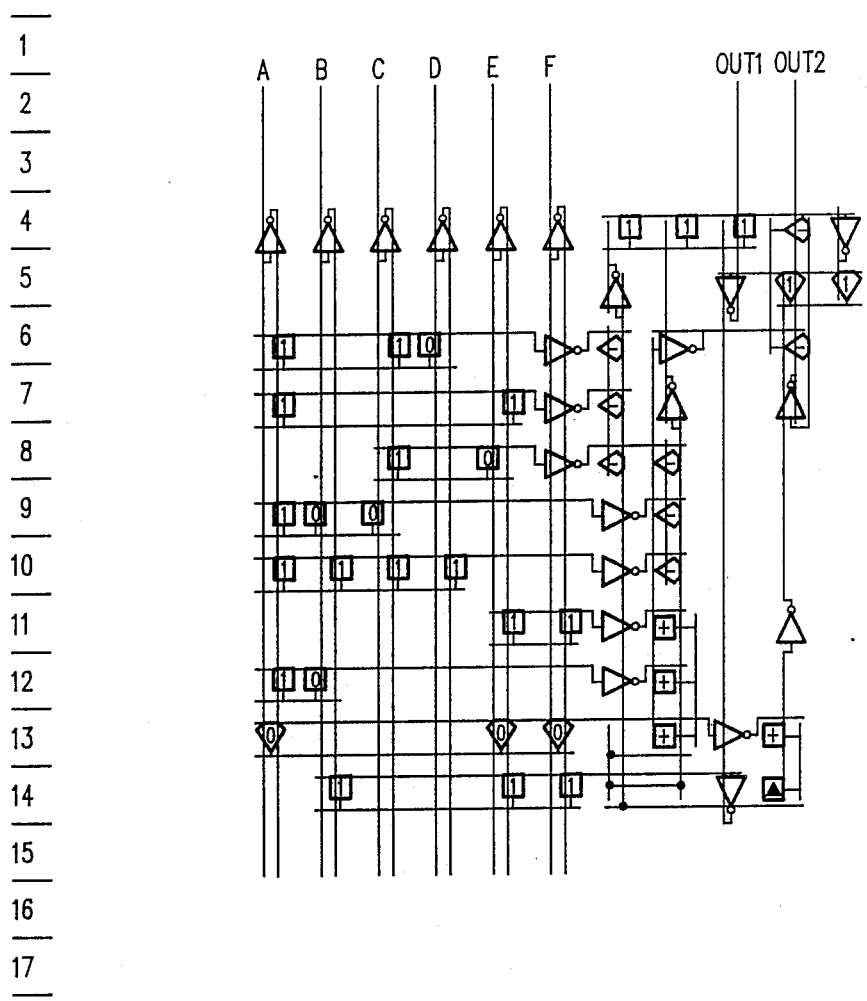

A logic schematic of a relatively complex combinational logic circuit is illustrated in FIG. 10a. Two possible Cirrus CMOS Cell Set tiled layouts are illustrated in FIGS. 10b and 10c, respectively. As is apparent from a visual comparison of the far more compact layout of FIG. 10c to the scattered layout of FIG. 10b, the tiling approach of the Cirrus CMOS Cell Set permits the designer to effect rapid design changes (such as the reorientation of inputs from FIG. 10b to FIG. 10c), and to redistribute functionality almost at will, thus providing for a significant increase in density.

Looking first at FIG. 10a, six inputs (A, B, C, D, E and F) are processed through this combinational logic circuit, which generates two outputs (OUT1 and OUT2). The circuit consists of eleven logical NAND gates (N-1–N-11), five logical OR gates (NR-1–NR-5) and many inverters (not labeled).

The implementation of this combinational logic circuit illustrated in FIG. 10b calls for inputs A, B and C to be fed vertically from the top right side of the circuit (where output OUT1 is generated), and for inputs D, E and F to be fed horizontally from the bottom left side of the circuit (where output OUT2 is generated).

Three-input logical NAND gate N-1 of FIG. 10a is implemented as three distributed sub-NAND gate tiles at row-column coordinates 16-d, 7-i and 7-k (the output of which is inverted), with tile 16-d being a vertical sub-NAND gate tile, connected to horizontal sub-NAND gate tiles 7-i and 7-k (and inverter 7-l) via an ohmic contact tile. Similarly, two-input NAND gate N-2 is comprised of vertical sub-NAND gate tile 17-e, connected to horizontal sub-NAND gate tile 9-i via an ohmic contact tile. The output of NAND gate N-2 is also inverted. Two-input NAND gate N-3 is comprised of vertical sub-NAND gate tile 17-f, connected to horizontal sub-NAND gate tile 10-k via an ohmic contact tile. The output of this NAND gate N-3 is also inverted.

The inverted outputs of these three NAND gates, N-1, N2 and N-3, are fed as inputs into logical NOR gate NR-1, which is comprised of three vertical sub-NOR gate tiles 7-m, 9-m and 10-m, the output of which is not only fed directly into horizontal sub-NAND gate tile 8-m of two-input NAND gate N-9, but is also inverted (and then fed into vertical sub-NAND gate tile 13-o of vertical NAND gate N-11).

The other input to NAND gate N-9, fed into horizontal sub-NAND gate tile 8-k, is generated by inverting the output of three-input NOR gate NR-3, which is comprised of vertical sub-NOR gate tiles 17-d and 18-d, connected by an ohmic contact tile to horizontal sub-NOR gate tile 8i. The output of NOR gate NR-3 is inverted and then routed by two ohmic contact tiles down column j, across row 9 and then up column k, until it reaches horizontal sub-NAND gate tile 8-k. Finally, the output of NAND gate N-9 is inverted and then fed into vertical sub-NOR gate tile 8-p of NOR gate NR-4.

Three-input logical NAND gate N-4 of FIG. 10a is implemented as three horizontal distributed sub-NAND gate tiles 11-i, 11-j and 11-k of FIG. 10b, the output of which is inverted and then fed into vertical sub-NOR gate tile 11-n of NOR gate NR-2. The other two inputs to NOR gate NR-2 are fed into vertical sub-NOR gate tile 10-n (from the inverted output of NAND gate N-3, passing through a "free" horizontal wire of vertical sub-NOR gate tile 10-m of NOR gate NR-1), and vertical sub-NOR gate tile 12-n (from the inverted output of four-input NAND gate N-5, which is comprised of vertical sub-NAND gate tile 16-e, connected via an ohmic contact tile to horizontal sub-NAND gate tiles 12-i, 12-j and 12-k).

The output of NOR gate NR-2 is produced by vertical sub-NOR gate tiles 10-n, 11-n and 12-n, and then inverted and fed into vertical sub-NAND gate tile 9-o of three-input NAND gate N-11. The other two inputs to NAND gate N-11 are fed into vertical sub-NAND gate tile 13-o (from the inverted output of NOR gate NR-1) and vertical sub-NAND gate tile 14-o (from the inverted output of three-input NAND gate N-10, which is comprised of vertical sub-NAND gate tiles 17-h and 18-h, connected via an ohmic contact tile to horizontal sub-NAND gate tile 14-j).

The output of vertical sub-NOR gate tiles 10-n, 11-n and 12-n of NOR gate NR-2 is not only inverted (and fed into NAND gate N-11), but is also fed directly into horizontal sub-NAND gate tile 15-n of three-input NAND gate N-8. The other two inputs to NAND gate N-8 are fed into horizontal sub-NAND gate tile 15-g (from the inverted output of two-input NAND gate N-6, which is comprised of vertical sub-NAND gate tiles 17-g and 18-g) and vertical sub-NAND gate tile 15-k (from the inverted output of two-input NAND gate N-7, which is comprised of horizontal sub-NAND gate tiles 13-i and 13-j, and which is transmitted down to tile 15-k through a "free" column wire in column k).

Finally, two-input NOR gate NR-4 is comprised of vertical sub-NOR gate tile 8-p (fed from the inverted output of NAND gate N-9) and vertical sub-NOR gate tile 10-p (fed from the inverted output of NAND gate N-11). The inverted output of NOR gate NR-4 (OUT1) is one of the two final outputs of the combinational logic circuit illustrated in FIG. 10a.

Two-input NOR gate NR-5 is comprised of horizontal subNOR gate tile 19-l (fed from the inverted output of horizontal NAND gate N-8) and horizontal sub-NOR gate tile 19-o (fed from the output of vertical NAND gate N-11. The inverted output of NOR gate NR-5 (OUT2) is the second of the two final outputs of the combinational logic circuit illustrated in FIG. 10a.

Thus, the distributed NAND and NOR gate function tiles of this invention, illustrated in FIG. 10b (including one-input NAND gate inverters), implement the combinational logic circuit illustrated in FIG. 10a. Moreover, FIG. 10b also illustrates how this invention facilitates the design and layout of complex circuits through the use of computer-aided design software. Individual tiles are merely laid out on an SLA template, and then moved around (i.e., distributing the functionality of gates and more complex functions) to accommodate other functions and their interconnections.

Note, however, that although this invention significantly increases overall density by reducing significantly the need for routing channels external to the individual tiles themselves, it does not completely eliminate the need for such routing channels (as is evident from the wasted space surrounding the ohmic contact tiles on the left side of FIG. 10b. In this example, the significant amount of wasted space is due primarily to the orientation of inputs A–F.

Yet, this invention provides such a significant degree of flexibility, with respect to the distribution of functionality (including the placement of inputs and outputs of logic gates and more complex functions) and the architecture of the layout, that even this wasted space can be minimized, as illustrated in the alternative, more compact, layout of FIG. 10c. Such flexibility illustrates how this invention enables the creation of complex integrated circuits with densities comparable to those obtained from hand-crafted custom design methods.

Looking at FIG. 10c, it can quickly be seen that this layout is far more straightforward and easier to follow, due to the reorientation of inputs A-F. All subgate elements are numbered as they were in FIG. 10b, although their orientation (horizontal/vertical) may have changed. NAND gates N-1–N-7 are densely tiled next to one another (in rows 6-12) NAND gates N-1–N-7 each consist of n horizontal sub-NAND gate tiles (where n is the number of gate inputs), the output of which is inverted by inverter tiles in columns i (inverting N-1–N-3) and j (inverting N-4–N-7).

Comparing this layout in FIG. 10c to the schematic logic diagram of FIG. 10a, it can easily be seen how the outputs of NAND gates N-1–N-3 are inverted and then fed into the inputs of NOR gate NR-1 (at sub-NOR gate tiles 6-j, 7-j and 8-j, respectively). In other words, this invention permits subgate elements to be tiled together so densely that the layout schematic of FIG. 10c follows naturally from the logic schematic of FIG. 10a, with the inter-gate routing virtually eliminated.

Similarly, it can easily be seen how the outputs of NAND gates N-3–N-5 are inverted and then fed into the inputs of NOR gate NR-2 (at sub-NOR gate tiles 8-k, 9-k and 10-k, respectively). Moreover, all of this functionality is implemented solely with sub-NAND gate tiles (the locations of which are distributed by the use of "blank" tiles or other "free conductor" tiles (not shown) to account for the various input combinations).

Contrasting FIGS. 10b and 10c, it is immediately apparent that the wasted space surrounding the ohmic contact tiles in FIG. 10b has been reclaimed in FIG. 10c. The same subgate elements (tiles) are present in both FIGS. 10b and 10c, but the bending of wires necessary to tile together orthogonally oriented subgate tiles in FIG. 10b has been eliminated in FIG. 10c. For example, the tiling of vertical sub-NAND gate tile 17-e and horizontal sub-NAND gate 9-i in FIG. 10b, via an ohmic contact tile (and its associated routing area) has been replaced by the relatively dense tiling of horizontal sub-NAND gate tiles 7-d and 7-h.

Thus, a significant improvement in density was obtained merely by reorienting the inputs all in the vertical direction, permitting the elimination of the routing area associated with the ohmic contact tiles in FIG. 10b. The only additional routing area added in FIG. 10c is the relatively small area occupied by two "new" ohmic tiles, used to route the output of vertical NOR gate NR-2 into vertical NAND gate N-8 (by transferring the signal down column k, back across row 14, up column j and across row 13 into vertical sub-NAND gate tile 13-k of NAND gate N-8).

Potential Extensions to the Basic Building Block Tiles of the Cirrus CMOS Cell Set In addition to the subgate tiles of the preferred embodiment of this invention, future embodiments might include more generalized subfunction tiles. For example, the various horizontal sub-NAND gate tiles of the Cirrus CMOS Cell Set are quite flexible in that "leftmost" tiles can be transformed into "middle" or "rightmost" tiles merely by late mask programming changes. As discussed above, this degree of flexibility provides for significant modifications of functionality.

Nevertheless, a horizontal sub-NAND gate tile cannot be transformed into a vertical sub-NAND gate tile or into any type of sub-NOR gate tile. It is conceivable that the degree of flexibility necessary to modify the functionality of these subgate (or subfunction) tiles could be enhanced significantly by generalizing the subfunction tiles, or by at least creating subfunction tiles which can be modified, via late mask programming, into functions of greater and greater complexity.

Figure 11A:
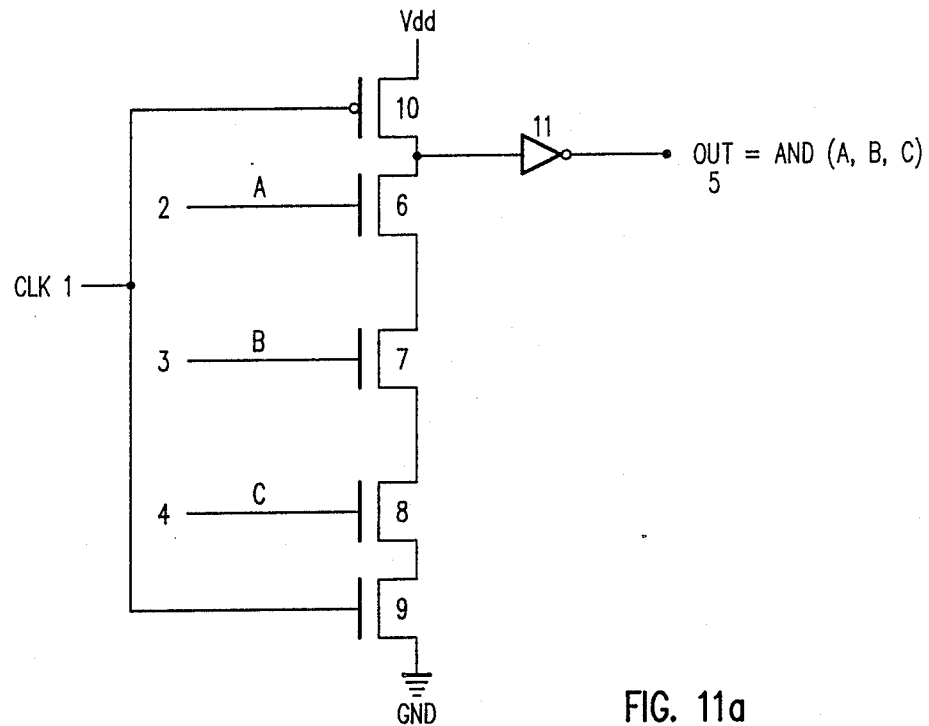
FIGS. 11a, 11b, 11c and 11d illustrate potential complex extensions to the basic building block tiles of the Cirrus CMOS Cell Set, including dynamic AND and OR gates, static CMOS "complex gates" and dynamic CMOS "complex gates".

For example, illustrated in FIG. 11a is a 3-input dynamic AND gate. Future embodiments may well contain general subgate tiles which, when combined with other such tiles of the same "tile class" will form arbitrary n-input versions of this gate.

Being dynamic, this gate generates an output synchronously with "high" pulses of clock signal (CLK) 1. Upon each such pulse of CLK 1, inputs A 2, B 3 and C 4 are logically ANDed, thereby generating output (OUT) 5. On alternating "low" CLK 1 signals, p-channel transistor 10 is activated, enabling the power signal (Vdd) to be transmitted through inverter 11, generating a "low" output 5 ("precharge phase").

The logical AND function is generated by transmitting inputs 2, 3 and 4 into the transistor gates of n-channel transistors 6, 7 and 8, respectively. Only when all three inputs (and CLK 1) are "high" will the "GND" signal be transmitted through the series of active n-channel transistors 9, 8, 7 and 6, and through inverter 11, finally generating a "high" output 5.

Figure 11B:
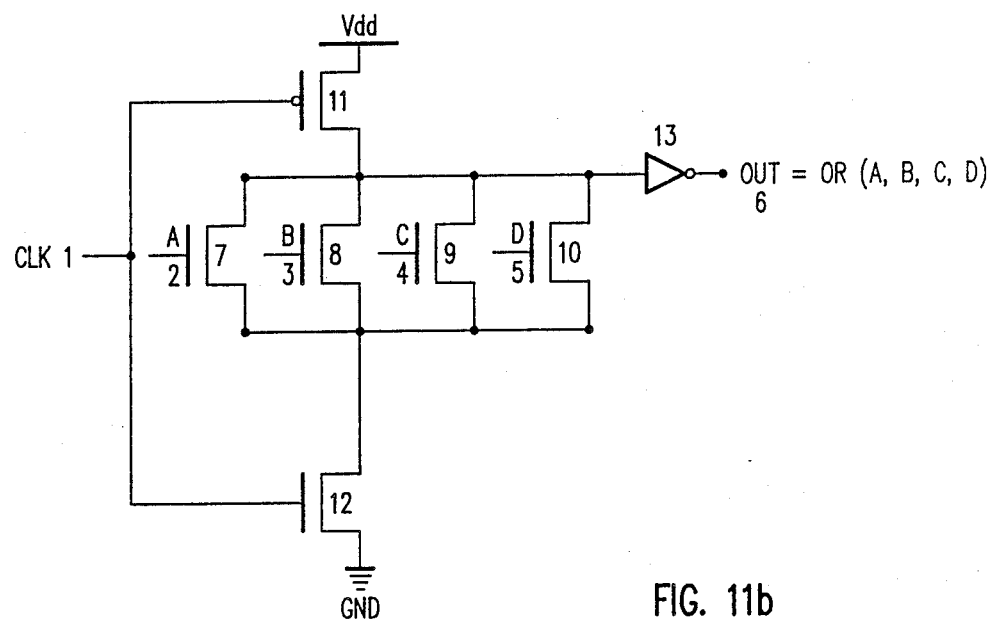

Similarly, the 4-input dynamic OR gate illustrated in FIG. 11b generates an output synchronously with "high" pulses of CLK signal 1, upon which inputs A 2, B 3 C 4 and D 5 are logically ORed. Because n-channel transistors 7, 8, 9 and 10 (corresponding to inputs 2, 3, 4 and 5, respectively) have their sources tied together and their drains tied together (as opposed to being connected in series as in FIG. 11a), any "high" input will permit the "GND" signal to be transmitted through n-channel transistor 12 and inverter 13, generating a "high" output 6.

Even more complex gates could be constructed (such as the Static CMOS Complex Gate illustrated in FIG. 11c) by creating subgate tiles consisting of pairs of n-channel and p-channel transistors, such as n-channel transistor B and p-channel transistor 14, each of which receives input A 1 at its transistor gate. Focusing on the lower portion of FIG. 11c, it can be seen that the output 20 of this gate is "low" when (1) input D 4 is "high" (activating n-channel transistor 11) or both input E 5 and input F 6 are "high" (activating n-channel transistors 12 and 13, respectively), (2) input C 3 is "high" (activating n-channel transistor 10) and (3) either input A 1 or B 2 is "high" (activating either n-channel transistor 8 or 9, respectively).

Figure 11C:
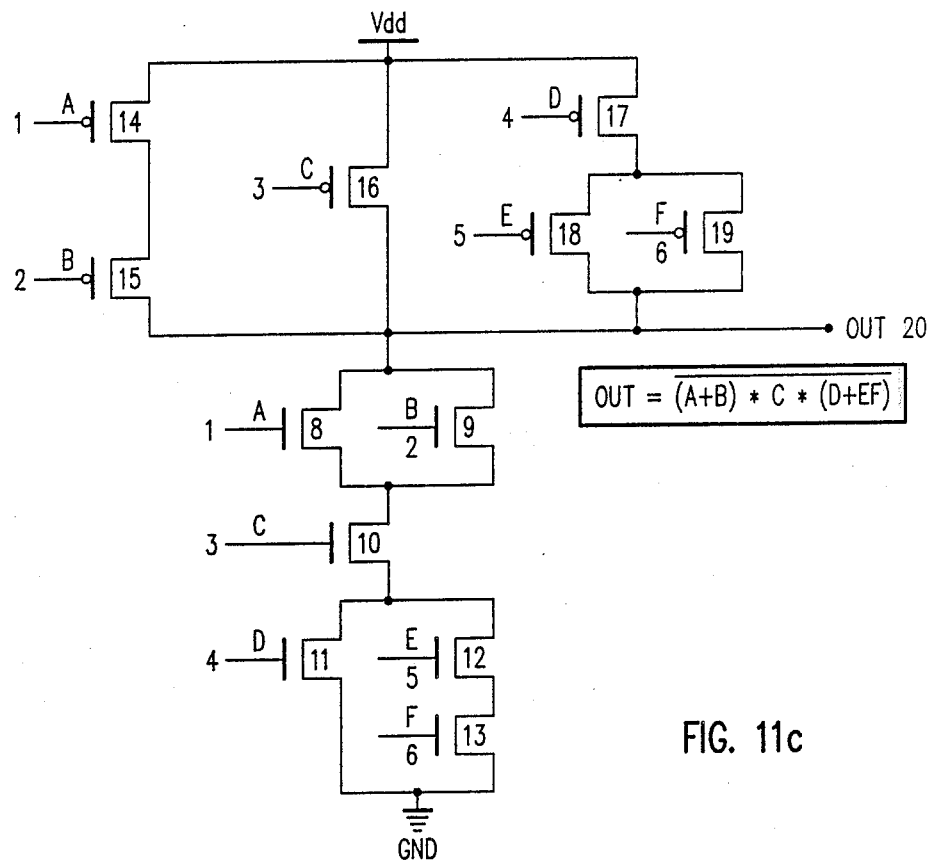

Conversely, focusing on the upper portion of FIG. 11c, output 20 of this gate is "high" when (1) both input A 1 and input B 2 are "low" (activating p-channel transistors 14 and 15, respectively), (2) input C 3 is "low" (activating p-channel transistor 16) or (3) input D 4 and either input E 5 or F 6 are "low" (activating p-channel transistor 17 and either p-channel transistor 18 or 19, respectively).

Figure 11D:
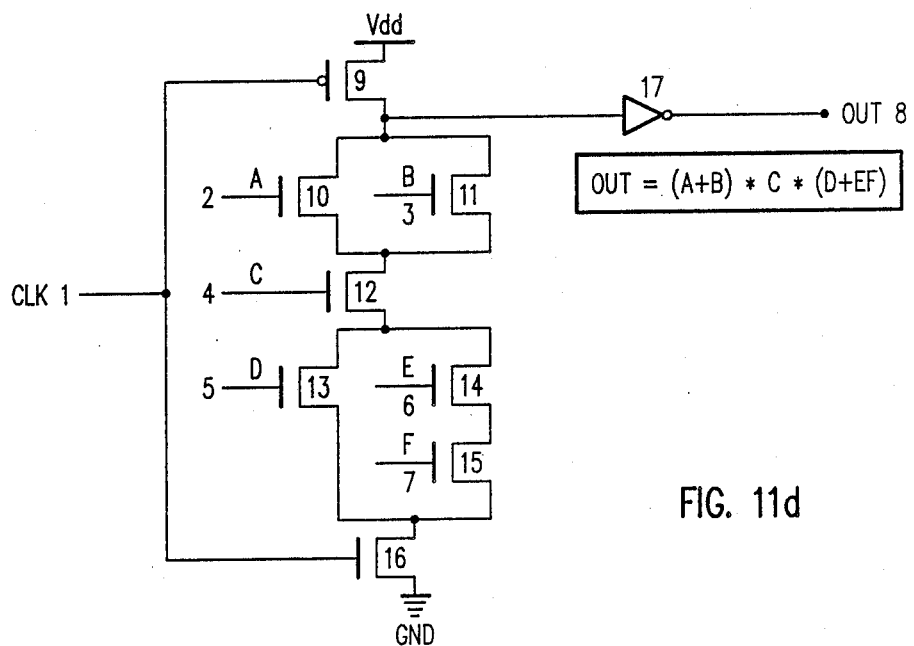

The Dynamic CMOS Complex Gate illustrated in FIG. 11d performs the converse logic function of that of FIG. 11c. Rather than generating a "low" output when the condition ((A+B) * C * (D+E F)) is met, this circuit inverts the "GND" signal (via inverter 17), generating a "high" output 8 when that condition is met.

The one other difference between FIGS. 11c and 11d is due to the fact that FIG. 11d illustrates a dynamic (not a static) circuit. Thus, the circuit is enabled only on "high" pulses of CLK signal 1, activating n-channel transistor 16 (and permitting the "GND" signal to flow through the circuit) When CLK signal 1 is "low" p-channel transistor 9 is activated, causing Vdd to be inverted (via inverter 17), generating a "low" output 8, a process known as "precharging".

An Example of the Significant Degree of Repairability Permitted by the Cirrus CMOS Cell Set FIGS. 12a-12d illustrate the significant degree of repairability afforded by the seemingly simple late mask programming changes which transform one sub-NAND gate tile into any other such tile. Changing a "rightmost" horizontal sub-NAND gate tile into a "middle" tile, for example, might permit the addition of a "rightmost" tile which permits an additional input to the NAND gate. Thus, a three-input NAND gate could be transformed into a four-input NAND gate, permitting a new condition (mistakenly omitted or newly added) to be involved in the determination, for example, of whether a particular register is write-enabled.

Figure 12A:
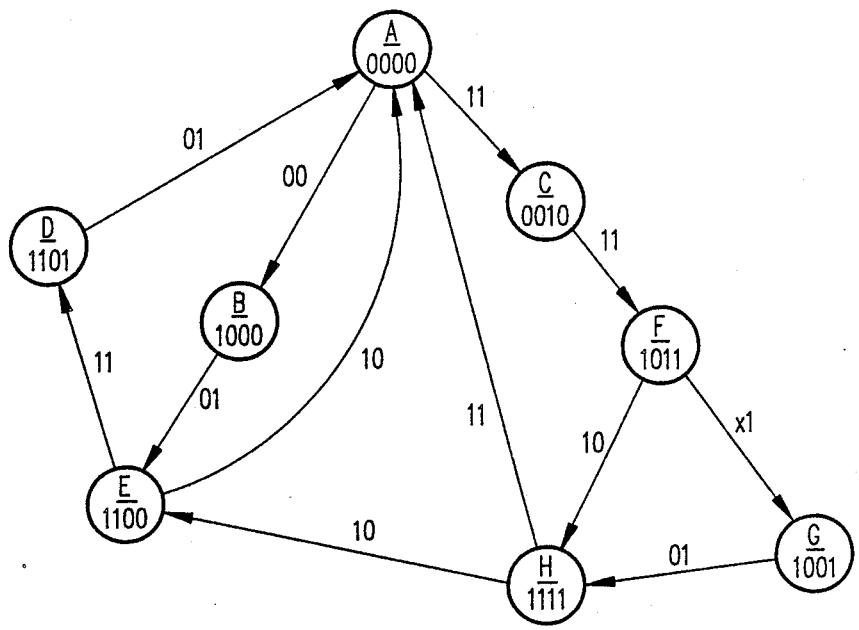

FIG. 12a illustrates the state graph for a two-input control state machine consisting of eight states (A-H). Particular inputs will cause the machine to change states. For example, if the machine is currently in state A (represented by "0000"), and the two inputs are "00" then the state of the machine changes to state B (represented by "1000"). If the inputs are "11" then the state of the machine changes to state C (represented by "0010"). The other two permutations of input pairs ("01" and "10") will not cause the machine to change states. A clock controls the state sequencing.

This control state machine might, for example, control the functioning of an ALU in a microcoded microprocessor. If the ALU is in a particular state (e.g., the ALU most recently performed an arithmetic operation), and if particular control signals are received from the currently executing microinstruction, then the ALU might make a transition to a different state (in which it automatically performs a branch operation if the result of the most recent operation was "0"), and also transmit two bits of output indicating that a branch might occur.

Figure 12C:
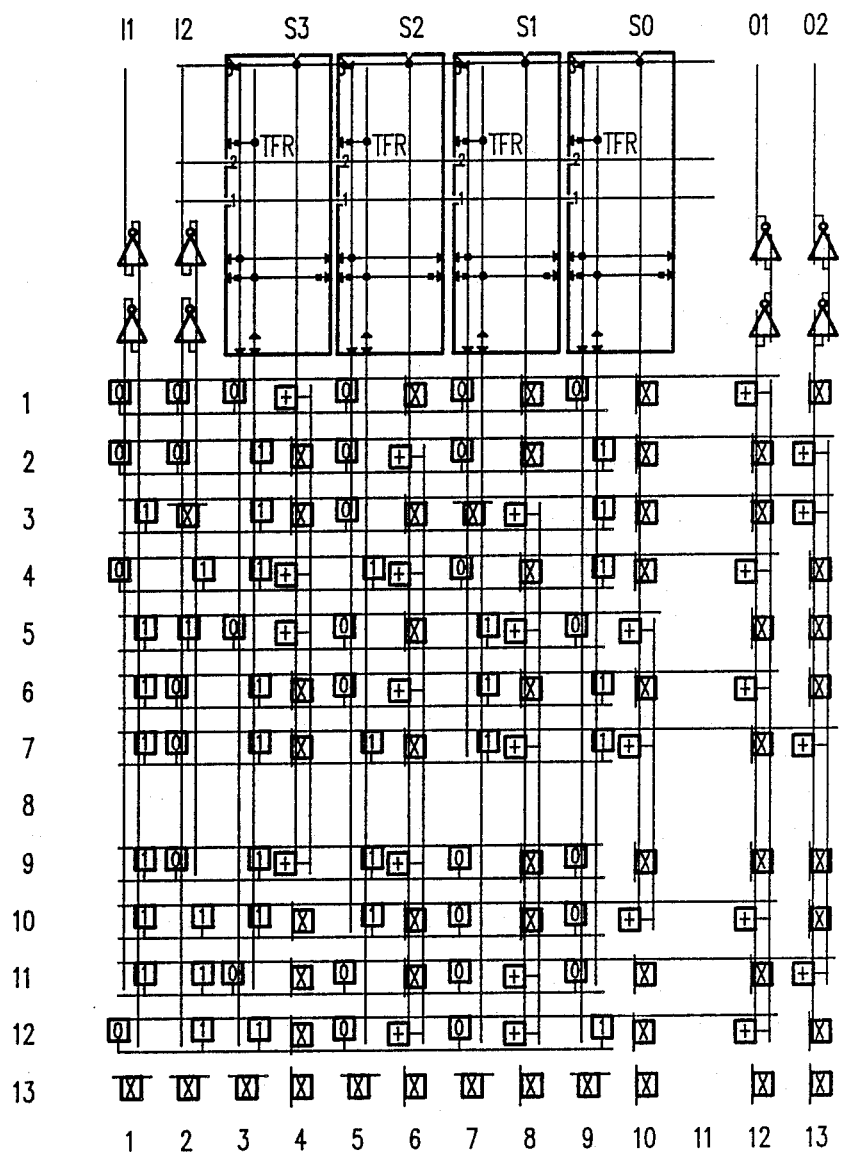
Figure 12D:
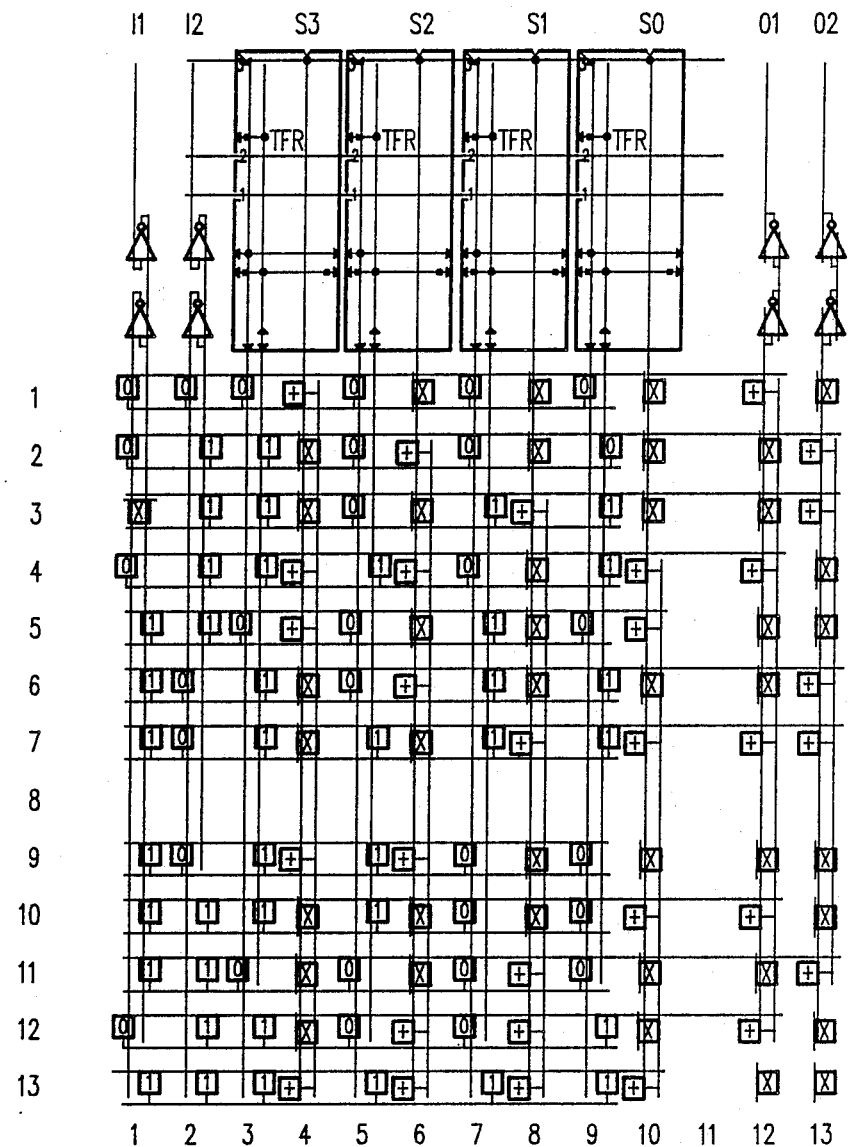

The important point is that, regardless of the particular function being performed by the control state machine that function can be represented in a state graph and then relatively easily transformed into the actual transistor layout of the circuit itself, as is illustrated in FIGS. 12c and 12d, and explained below.

FIG. 12b represents this same information in tabular form. Both the top and bottom tables, labeled "Incorrect Control State Machine" and "Correct Control State Machine", respectively, are designed to include one row for each of the twelve state transitions.

The leftmost two columns, labeled "I1" and "I2", represent the values of the two inputs to the machine. The next four columns, labeled "S3", "S2", "S1" and "S0", together represent the four-bit value of each of the eight states of the machine Because four bits are used in this example, eight additional states could be added. Each bit of the state will, of course, be implemented as an individual flip flop tile (see FIGS. 12c and 12d).

The last two columns, labeled "01" and "02" represent two output bits which indicate that particular state transitions have occurred, and which can be used for any purpose, by tiling these outputs to additional logic and/or memory tiles. It should be noted that a "+" in any of the four state bit columns indicates that the particular state bit will be "toggled" (from "0" to "1" or from "1" to "0") if the conditions for that state transition are met, whereas a "+" in either of the output bit columns indicates that the output bit will "fire" (i.e., will be a "1" or "high" signal) if the conditions for that state transition are met.

The Incorrect Control State Machine table on the top of FIG. 12b illustrates that, as the complexity of the logic increases, mistakes are likely to occur. Moreover, specifications may change and, of course, designers frequently modify their logic throughout the design process, necessitating subsequent modifications to the actual implementation itself. The preferred embodiment of this invention permits these modifications to be made quite easily at any stage of the process.

For example, in the second row of the Incorrect Control State Machine table, the designer might accidentally specify the wrong condition upon which a state transition will occur. Rather than specifying a "1" for input "I2", the designer might specify a "0". This "wrong symbol" is represented by a "W" next to that symbol.

In the third row, the designer might accidentally specify a "1" for input "I1" when in fact an "X" (i.e., no symbol) should be specified, because that particular state transition will occur regardless of the value of input "I1". The incorrectly specified "1" is therefore an "extra symbol" which is represented by an "E" next to that symbol. The "X" (or the absence of a symbol) represents a "spare cell" such as the "special blank" sub-NAND gate tile discussed above, which can be transformed into any other sub-NAND gate tile should the necessity arise (e.g., when a new condition needs to be added to a 3-input NAND gate, requiring this extra resource to form a 4-input NAND gate). These spare cells are often liberally utilized throughout a circuit design, particularly in places where the space occupied by these spare cells is already within the geometrical area occupied by the chip.

Also in the third row, the designer might specify an "X" for input "I2" when in fact a "0" or "1" symbol is necessary, because the state transition of that row is dependent upon the value of input "I2". The absence of this "missing symbol" is represented by an "M".

The designer might even mistakenly leave out an entire row (such as the twelfth row), representing a forgotten state transition. Or perhaps a new state transition is determined to be necessary at some later point during the implementation of this control state machine.

In any event, the Corrected Control State Machine table at the bottom of FIG. 12b illustrates the changes necessary to fix the tabular representation of this machine. But, the designer may not discover these mistakes, or desired additions, until later in the implementation process. FIG. 12c illustrates the actual incorrect SLA implementation of this machine which the designer might produce utilizing the tiles of the Cirrus CMOS Cell Set.

The two inputs to this machine, "I1" and "I2", are transmitted vertically from the top of this machine, and the two outputs, "01" and "02", are also transmitted vertically out the top of this machine. Each of the four state bits is held in an individual T (toggle) flip flop ("TFR"), representing (from left to right) bits "S3", "S2", "S1" and "S0".

The most notable feature of this tiled layout is the direct correlation between the tabular representation of the machine, in the Incorrect Control State Machine table at the top of FIG. 12b, and the actual layout schematic in FIG. 12c. For example, the twelve rows in that table in FIG. 12b correspond directly to the twelve rows of horizontal ("0" or "1") and vertical ("+") sub-NAND gate tiles (including spare tiles represented by a vertical bar to the left of an "X" for vertical spare tiles, and a horizontal bar on top of an "X" for horizontal spare tiles).

Looking at the first row of the sub-NAND gate tiles in FIG. 12c, it can be seen that a six-input horizontal NAND gate is formed from six horizontal sub-NAND gate tiles at row-column coordinates 1-1, 1-2, 1-3, 1-5, 1-7 and 1-9. Tiles 1-1 and 1-2 receive as input the complements of inputs "I1" and "I2" respectively (as indicated by a "0" in those tiles), while tiles 1-3, 1-5, 1-7 and 1-9 receive as input the complements of state bits "S3", "S2", "S1" and "S0", respectively.

Note that any tile corresponding to a "1" condition for a state transition (e.g., tiles 3-1 and 3-2) receives the actual column value (columns "I1" and "S3", respectively), rather than the complement of such value. This scheme insures that "1" signals are received as an indication that the input and state conditions are met, such that only if all conditions are met will the NAND function generate a "0". Otherwise (if any condition is not met), the result of the NAND function will be a "1" which will not cause a state transition.

As represented by the first row of the Incorrect Control State Machine at the top of FIG. 12b, the state transition will occur only if all six of these bits (the two input bits and the four state bits) are "0" (i.e., a "low" signal) In other words, if all six bits are "0" each of their complements will be a "1" generating a "0" as the result of the NAND function. If any of these six bits is a "1"-then this state transition will not occur because the complement of any such bit will be a "0" generating a "1" as the result of the NAND function.

If the result of the NAND function is a "0" the appropriate output is transmitted as signals "01" and "02", and a state transition occurs, causing (in the case of row 1) state bit "S3" to be toggled, leaving the machine in state B ("1000").

For example, in row 1 of the sub-NAND gate tiles in FIG. 12c, the result of the NAND function is transmitted along the uppermost wire of each of the tiles into vertical sub-NAND gate tile 1-12 (and out of the array as "01"). In fact, each row which generates a "1" as output signal "01" in response to a state transition in that row (e.g., row 4) contains such a tile (tile 4-4). If no output is to be generated by that row (e.g., row 1 generates no output signal "02"), then a spare tile (tile 1-13) is employed. This enables the designer to later change his mind and modify this portion of the circuit, via late mask programming, so as to generate an output signal "02".

If the result of the NAND function is a "0" then output signal "01" is a "1" because the value of output signal "01" is determined by "NANDing" the output from each row "n" which generates a "0" as the input to "tile n-12". Thus, if row 1 generates a "0" (because all six signals "I1", "I2", "S3", "S2", "S1" and "S0" equal "0"), or if any of the rows which contains such a vertical sub-NAND gate tile generates a "0", then column 12 ("01") will generate a "1" (as the logical NAND of all "0s").

Note, however, that row 1 generates no output on signal "02" (although other rows, such as row 2, might generate such an output), because tile 1-13 is a spare tile which is not part of the vertical NAND gate (consisting of tiles 213, 3-13, 6-13, 7-13 and 11-13).

In addition to generating outputs, row 1 also causes a state transition to occur (from state A to state B) if all six signals are "0". Looking at row 1 of the Incorrect Control State Machine on the top of FIG. 12b, or the graph in FIG. 12a, it is apparent that, when the machine is in state A ("0000") and inputs "00" are received as "I1" and "I2", a state transition occurs to state B ("1000"). In other words, state bit "S3" is toggled from a "0" to a "1".

Looking back at FIG. 12c, it can be seen that this is accomplished by tiling the output of the six-input horizontal NAND gate, comprised of tiles 1-1, 1-2, 1-3, 1-5, 1-7 and 1-9, into tile 1-4, a vertical sub-NAND gate tile. Just as any "0" signal generated along a row with a sub-NAND gate tile in column 12 ("01") generates a "1" as signal "01" any such "0" signal generated along a row with a subNAND gate tile in column 4 ("S3"), such as tile 1-4 in row 1, generates a "1" in column 4, which causes the flip flop representing state bit "S3" to be toggled (in this case from "0" to "1").

The other eleven rows of horizontal and vertical sub-NAND gate tiles in FIG. 12c operate in a similar manner, with "tiles n-1, n-2, n-3, n-5, n-7 and n-9" NANDing together signals "I1", "I2", "S3", "S2", "S1" and "S0", the result of which is an input to vertical sub-NAND gate tiles in columns 4 ("S3"), 6 ("S2"), 8 ("S1"), 10 ("S0"), 12 ("01") and 13 ("02"), respectively.

Thus, FIGS. 12b and 12c illustrate the direct correlation between the tabular representation and the actual transistor layout of an integrated circuit, such as this control state machine. Such a correlation demonstrates how this invention facilitates the rapid design of a densely tiled integrated circuit. It is not difficult to imagine how the Cirrus CMOS Cell Set permits the extremely quick transformation from a prototype to high volume production.

But, as mentioned earlier, it is almost guaranteed that a complex design will result, at least initially, in many specification changes and logic errors, such as those illustrated by the Incorrect Control State Machine table on the top of FIG. 12b. Perhaps an even more significant feature of this invention is the ease with which those changes can be effected, and errors corrected, at any stage of the design (whether by modifications to the tabular representation on paper, the transistor layout as represented in software, or even to the actual fabricated chip itself, via late mask programming).

A comparison of FIGS. 12c and 12d illustrates how, even in a relatively complex design, modifications such as those from the Incorrect Control State Machine to the Corrected Control State Machine of FIG. 12b can be effected with relative ease. It is important to emphasize again that the modifications to FIG. 12c (resulting in corrected FIG. 12d) can be made not only on paper (or, more likely, in software) but also after the chip has been fabricated. Such modifications involve, as discussed above, late mask programming changes which transform individual subfunction (in this case sub-NAND gate) tiles into other tiles which are usually (but not necessarily) of the same tile class.

For example, tile 2-2 of FIG. 12c (which was specified mistakenly as a "0" instead of a "1") has been correctly specified as a "1" in FIG. 12d. Similarly, tile 5-8 of FIG. 12c (which was specified mistakenly as a "+" instead of an "X") has been correctly specified as an "X" in FIG. 12d. All other differences between FIGS. 12c and 12d similarly correspond to those changes illustrated in FIG. 12b (from the Incorrect Control State Machine to the Corrected Control State Machine). Such changes are easily effected in software, and can also be effected after the chip has been fabricated, via the late mask programming modifications discussed above with respect to FIG. 6.

It can thus be seen quite clearly that the tiling of the Cirrus CMOS Cell Set tiles enables the relatively simple creation not only of an extremely dense integrated circuit, but of one which can be modified, simply and inexpensively, throughout the design process, and even after a chip has been fabricated.

We claim:

1. An integrated circuit comprising:
    a laterally-extending substrate on which there is defined an elongated function area composed of at least three tile areas joined one to the next, a first and second of the tile areas being structured as terminating tile areas of the elongated function area and a third of the tile areas being differently structured as a middle tile area interposed between the terminating tile areas;
    wherein each of the tile areas is of substantially the same size so that a tiled plurality of such tile areas may define a grid;
    wherein each tile area includes within its boundaries P and N field effect transistors having source and drain portions defined in a diffusion layer of the substrate and gate portions defined by a gate layer overlying the diffusion layer, the gate portions of the P and N transistors being joined to one another by a common segment of the gate layer;
    wherein each tile area further includes an input wire piece extending in a first lateral direction above the gate layer, the input wire piece connecting by way of a contact to a central portion of the common gate layer segment and other portions of the common gate layer segment defining the gate portions of the P and N transistors; and
    wherein each tile area also includes an output wire piece extending in a second lateral direction different from the first lateral direction, the output wire piece passing insulatively by the input wire piece of its respective tile area, the output wire piece being positioned to contact to at least the drain portion of one of the P and N transistors in its respective tile area.

2. The integrated circuit of claim 1 wherein each tile area further includes a lame wire for coupling the drain of one of its P and N transistors to the source of a like transistor in another tile area of the elongated function area.

3. The integrated circuit of claim 1 wherein each tile area further includes spaced apart parallel power lines for supplying opposed voltage levels to the source portions of the P and N transistors within that tile area.

4. An integrate circuit comprising:
    a laterally extending substrate;
    a first elongated function area defined on said substrate to extend in a first lateral direction, the first function area having a first output wire extending therethrough in the first lateral direction and a first input wire extending therein along a second lateral direction at an angle to the first lateral direction, the first function area further having a first set of complementary P and N type field effect transistors, the gates of the transistors in the first set of complementary transistors being coupled to the first input wire, a drain of one transistor in the first set being coupled to the first output wire; and
    a second elongated function area defined on said substrate to extend in the second lateral direction, the second function area having a second output wire extending therethrough in the second lateral direction and a second input wire extending therein along the first lateral direction, the second function area further having a second set of complementary P and N type field effect transistors, the gates of the transistors in the second set being coupled to the second input wire, a drain of one transistor in the second set being coupled to the second output wire;
    wherein the output wire of the first function area is coextensive with the input wire of the second function area.

5. An integrated circuit comprising:
    a laterally-extending upper conductor layer having upper wire pieces;
    a laterally-extending lower conductor layer having lower wire pieces, the lower wire pieces crossing under the upper wire pieces;
    a via layer interposed between the upper and lower conductor layers, the via layer having defined therein a predetermined pattern of vias for coupling preselected wire pieces of the upper conductor layer to preselected wire pieces of the lower conductor layer;
    a base structure composed of one or more laterally-extending base layers below the lower conductor layer, including a conductive gate layer, the base structure including diffusion regions for defining source and drain portions of P-type and N-type field effect transistors, each transistor having a gate electrode defined by a portion of the gate layer;
    a first laterally-extending tile area for defining at least part of a first elongated function area, the first tile area encompassing within its boundaries a first portion of the base structure including at least a first P-type transistor and at least a first N-type transistor, wherein the gate electrodes of the first P-type and N-type transistors are defined by a first continuous and nonlinear portion of the gate layer, the first tile area further encompassing a first output wire-piece defined by a wire piece in a first of the lower and upper conductor layers, the first output wire-piece being coupled to a drain portion of at least one of the first P-type and N-type transistors and extending in a first of different lateral directions for conducting a first output signal of the first function are in said first lateral direction, the first tile area further encompassing a first input wire-piece defined by a wire piece in a second of the lower and upper conductor layers, the first input wire-piece extending in a second of the different lateral directions and connecting to the first gate layer portion for conducting a first input signal of the first function area in said second lateral direction to the gate electrodes of the first P-type and N-type transistors; and
    a second laterally-extending tile area for defining in combination with the first tile area at least part of the first elongated function area, the second tile area encompassing within its boundaries a second portion of the base structure including at least a second P-type transistor and a second N-type transistor, wherein the gate electrodes of the second P-type and N-type transistors are defined by a second continuous and nonlinear portion of the gate layer, the second tile area further encompassing a second output wire-piece defined by a wire piece in the first of the lower and upper conductor layers, the second output wire-piece extending in the first lateral direction, being coupled to a drain portion of at least one of the second P-type and N-type transistors, and being further coupled to the first output wire-piece of the first tile area for conducting the first output signal of the first function area in said first lateral direction at least partially through the second tile area, the second tile area further encompassing a second input wire-piece defined by a wire piece in the second of the lower and upper conductor layers, the second input wire-piece extending in the second lateral direction and connecting to the second gate layer portion for conducting a second input signal of the first function area in said second lateral direction to the control electrodes of the second P-type and N-type transistors.

6. The integrated circuit of claim 5 wherein the gate layer is composed to polysilicon and at least one of the upper and lower conductor layers is composed of metal.

7. The integrated circuit of claim 5 wherein the first and second gate layer portions each include a substantially U-shaped region.

8. The integrated circuit of claim 5 wherein each tile area has only one P-type transistor and only one N-type transistor.

9. The integrated circuit of claim 5
wherein the first tile area is adjacent to the second tile area;
wherein an output one of the transistors in the first tile area has its drain portion defined by a first output diffusion region, an output one of the transistors in the second tile area has its drain portion defined by a second output diffusion region spaced apart from the first output diffusion region; and
wherein the spaced apart first and second output diffusion regions are electrically connected to one another by the first and second output wire-pieces.

10. The integrated circuit of claim 5 wherein the first and second tile areas have substantially different patternings of wire pieces in their respectively encompassed portions of the upper and lower conductor layers so as to define terminal or middle subfunction portions of the elongated first function area.

11. The integrated circuit of claim 5 further comprising:
one or more series wire-pieces defined within each of the tile areas and coupled to a source or drain portion of one of the P-type and N-type transistors in its respective tile area;
wherein a first series wire-piece in the first tile area is joined to a second series wire-piece in the second tile area so as to couple the source portion of the one transistor in the first tile area to the drain portion of the one transistor in the second tile area.

12. An integrated circuit according to claim 5
wherein the first and second tile areas are adjacent;
wherein an output one of the transistors in the first tile area has its drain portion defined by a first output diffusion region, an output one of the transistors in the second tile area has its drain portion defined by a second output diffusion region spaced apart from the first output diffusion region; and
wherein the spaced apart first and second output diffusion regions are electrically connected to one another by the first and second output wire-pieces.

13. An integrated circuit according to claim 5
wherein each tile area further encompasses a power grid formed of spaced apart Vdd and GND wire-pieces, said Vdd and GND wire-pieces being defined by wire pieces in the second of the lower and upper conductor layers.

14. An integrated circuit according to claim 5
wherein the first and second tile areas are adjacent portions of the first elongated function area and wherein the first and second tile areas have substantially different patternings of wire pieces in their respectively encompassed portions of the upper and lower conductor layers so as to respectively define terminal or middle subfunction portions of the first elongated function area.

15. The integrated circuit of claim 5
wherein the first and second tile areas have respective first and second series wire-pieces each coupled to a source or drain potion of a series-coupled one of the P-type and N-type transistors in its respective tile area and each series wire-piece extends parallel to the output wire-piece of its respective tile area; and
wherein the first and second series wire-pieces are joined to define a series circuit including the series-coupled one transistor in the first tile area and the series-coupled one transistor in the second tile area.

16. The integrated circuit of claim 15 wherein the first and second tile areas are joined to operatively define a NAND gate which can receive first and second input signals respectively on the first and second input wire-pieces and which can generate a corresponding NAND gate output signal on the first and second output wire-pieces.

17. The integrated circuit of claim 5 wherein each tile area further encompasses part of a power grid formed of spaced apart Vdd and GND wire-pieces arranged in alternating fashion one after the next, said Vdd and GND wire-pieces being defined by wire pieces in the lower or upper conductor layers.

18. The integrated circuit of claim 17 wherein the Vdd and GND wire-pieces are defined in the second of the lower and upper conductor layers to extend in the second lateral direction thereby allowing the output wire-pieces of the first and second tile areas to be extended in the first lateral direction insulatively across the Vdd and GND wire-pieces.

19. The integrated circuit of claim 5 further comprising:
a third laterally-extending tile area for defining at least part of a second elongated function area having a longitudinal axis at an angle to a corresponding longitudinal axis of the first function area, the third tile area encompassing within its boundaries a third portion of the base structure including at least a third P-type transistor and at least a third N-type transistor, wherein the gate electrodes of the third P-type and N-type transistors are defined by a third continuous and nonlinear portion of the gate layer, the third tile area further encompassing a third output wire-piece defined by a wire piece in the second of the lower and upper conductor layers, the third output wire-piece being coupled to a drain portion of at least one of the third P-type and N-type transistors and extending in the second lateral direction for conducting a second output signal belonging to the second function area in said second lateral direction, the third tile area further encompassing a third input wire-piece defined by a wire piece in the first of the lower and upper conductor layers, the third input wire-piece extending in the first lateral direction and connecting to the third gate layer portion for conducting a third input signal belonging to the second function area in said fist lateral direction to the gate electrodes of the third P-type and N-type transistors; and a fourth laterally-extending tile area for defining in combination with the third tile area at least part of the second function area, the fourth tile area encompassing within its boundaries a fourth portion of the base structure including at least a fourth P-type transistor and a fourth N-type transistor, wherein the gate electrodes of the fourth P-type and N-type transistors are defined by a fourth continuous and nonlinear portion of the gate layer, the fourth tile area further encompassing a fourth output wire-piece defined by a wire piece in the second of the lower and upper conductor layers, the fourth output wire-piece being coupled to a drain portion of at least one of the fourth P-type and N-type transistors and extending in the second lateral direction and being coupled to the third output wire-piece of the third tile area for conducting the second output signal in said second lateral direction at least partially through the fourth tile area, the fourth tile area further encompassing a fourth input wire-piece extending in the first lateral direction and connecting to the fourth gate layer portion for conducting a fourth input signal belonging to the second function area in said first lateral direction to the control electrodes of the fourth P-type and N-type transistors.

20. The integrated circuit of claim 19 wherein an output wire-piece of the first function area is coextensive with an input wire-piece of the second function area.

21. The integrated circuit of claim 19 further comprising:
one or more series wire-pieces defined within each of the tile areas and coupled to a source or drain portion of one of the P-type and N-type transistors in its respective tile area;
wherein a first series wire-piece in the first tile area is joined to a second series wire-piece in the second tile area so as to couple the source portion of the one transistor in the first tile area to the drain portion of the one transistor in the second tile area, and
wherein a third series wire-piece in the third tile area is joined to a fourth series wire-piece in the fourth tile area so as to couple the source portion of the one transistor in the third tile area to the drain portion of the one transistor in the fourth tile area.

22. The integrated circuit of claim 5 wherein the first and second gate layer portions each include a substantially W-shaped region.

23. The integrated circuit of claim 22 wherein the W-shaped region is composed of polysilicon.

24. The integrated circuit of claim 22 wherein the input wire-piece of each tile area is coupled by way of a contact to a substantially middle portion of the W-shaped region.

25. The integrated circuit of claim 22 further comprising one or more free wire-pieces defined within each of the first and second tile areas from wire pieces in the second of the lower and upper conductor layers, the free wire-pieces overlying and being insulated from the W-shaped regions within their respective tile areas such that the free wire-pieces are available for insulatively conducting signals in the second lateral direction through their respective tile areas.

* * * * *